(12) United States Patent
Sung et al.

(10) Patent No.: US 9,684,084 B2
(45) Date of Patent: Jun. 20, 2017

(54) THREE-DIMENSIONAL MULTI-MODAL CORE AND GEOLOGICAL MODELING FOR OPTIMAL FIELD DEVELOPMENT

(71) Applicant: Saudi Arabian Oil Company, Dhahran (SA)

(72) Inventors: Roger R. Sung, Dhahran (SA); Edward A. Clerke, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 698 days.

(21) Appl. No.: 13/873,463

(22) Filed: Apr. 30, 2013

(65) Prior Publication Data

US 2013/0297272 A1 Nov. 7, 2013

Related U.S. Application Data

(60) Provisional application No. 61/640,790, filed on May 1, 2012.

(51) Int. Cl.
*G06G 7/48* (2006.01)
*G01V 1/30* (2006.01)
(Continued)

(52) U.S. Cl.
CPC .............. *G01V 1/306* (2013.01); *G01V 11/00* (2013.01); *G01V 99/005* (2013.01); *G06F 17/5009* (2013.01); *G01V 2210/622* (2013.01)

(58) Field of Classification Search
CPC ...... G01V 11/00; G01V 1/306; G01V 99/005; G06F 17/5009
(Continued)

(56) References Cited

U.S. PATENT DOCUMENTS 6,374,185 B1* 4/2002 Taner .................. G01V 1/282
367/73
9,260,947 B2* 2/2016 Lu ........................... E21B 43/00
(Continued)

OTHER PUBLICATIONS

Gifford et al.("Collaborativemulti-agentrockfaciesclassification-from wireline welllogdata", Elsevier,2010, pp. 1158-1172).*
(Continued)

*Primary Examiner* — Omar Fernandez Rivas
*Assistant Examiner* — Iftekhar Khan
(74) *Attorney, Agent, or Firm* — Bracewell LLP; Constance G. Rhebergen; Albert B. Kimball, Jr.

(57) ABSTRACT

A roadmap for a field development strategy for optimal recovery is provided in a high quality 3D geological model. This geological model combines geological attributes, pore and rock properties for an optimum 3D representation of the reservoir thousands of feet beneath the surface. The model is based on the pertinent geological facies, derived from well core description and detailed studies of rock, as well as fluid and pore properties (Full Pore System) obtained from laboratory analyses of core material and well log data. These data differentiate various important pore throat and pore body regions and relationships, i.e., macroporosity and microporosity. Understanding hydrocarbon volumes in the various pore type groups and then establishing proper recovery techniques through focused laboratory studies yields a field development strategy that can significantly increase hydrocarbon recovery from a reservoir.

13 Claims, 26 Drawing Sheets

(51) Int. Cl.
    *G01V 11/00* (2006.01)
    *G06F 17/50* (2006.01)
    *G01V 99/00* (2009.01)

(58) Field of Classification Search
    USPC .......................................................... 703/10
    See application file for complete search history.

(56) References Cited

U.S. PATENT DOCUMENTS

| | | | |
|---|---|---|---|
| 2003/0193837 A1* | 10/2003 | Rommel | G01V 1/003 367/37 |
| 2007/0061082 A1* | 3/2007 | Seleznev | G01V 3/30 702/11 |
| 2008/0249906 A1* | 10/2008 | Landis, Jr. | E21B 49/00 705/35 |
| 2009/0248309 A1* | 10/2009 | Neville | G01V 5/107 702/8 |
| 2010/0277167 A1* | 11/2010 | Romero | G01N 24/081 324/303 |
| 2011/0015912 A1* | 1/2011 | Oppert | G01V 99/00 703/10 |
| 2011/0153285 A1* | 6/2011 | Da Veiga | G01V 11/00 703/1 |
| 2011/0213600 A1* | 9/2011 | Strebelle | G01V 99/00 703/10 |
| 2011/0257944 A1* | 10/2011 | Du | E21B 43/267 703/2 |
| 2012/0150501 A1* | 6/2012 | Wu | G01V 99/005 703/2 |
| 2012/0197526 A1* | 8/2012 | Leyte Guerrero | G01N 15/088 702/2 |
| 2012/0221306 A1* | 8/2012 | Hurley | G01V 99/005 703/6 |
| 2012/0265512 A1* | 10/2012 | Hu | G01V 99/005 703/10 |
| 2012/0281883 A1* | 11/2012 | Hurley | G01N 21/6458 382/109 |
| 2013/0030777 A1 | 1/2013 | Sung et al. | |
| 2013/0080133 A1 | 3/2013 | Sung et al. | |
| 2013/0179080 A1* | 7/2013 | Skalinski | G01V 99/00 702/7 |

OTHER PUBLICATIONS

Li et al.("Facies identification from well logs: A comparison of discriminant analysis and naïve Bayes classifier", Elsevier,2006, pp. 149-157).*

Akin et al. "Combination of well log and pore-scale data to predict petrophysical properties of diatomite" Journal of Petroleum Science & Engineering, vol. 60, No. 3-4, XP-22526942, Amsterdam, NL, Mar. 1, 2008, pp. 133-149.

Al-Emadi et al. "3D Modeling of the Arab Formation (Maydan Mahzam Field, Offshore Qatar): An Integrated Approach" International Petroleum Technology Conference, IPTC 13461, XP-002722942, Doha, Qatar, Dec. 7-9, 2009, pp. 1-17.

Cantrell et al. "Microporosity in Arab Formation Carbonates, Saudi Arabia" GeoArabia, vol. 4, No. 2, XP-002722941, Gulf PetroLink, Bahrain, 1999, pp. 129-154.

International Search Report and Written Opinion, PCT/IB2013/000978, mailed Apr. 24, 2014.

Rebelle et al. "Pore to Grid Carbonate Rock-Typing" International Petroleum Technology Conference, IPTC 13120, XP-002722940, Doha, Qatar, Dec. 7-9, 2009, pp. 1-9.

Saggaf et al. "Estimation of Lithologies and Depositional Facies From Wireline Logs" AAPG Bulletin, vol. 84, No. 10, XP-002722939, Oct. 2000, pp. 1633-1646.

Clerke et al., Application of Thomeer Hyperbolas to decode the pore systems, facies and reservoir properties of the Upper Jurrassic Arab D Limestone, Ghawar field, Saudi Arabia: A "Rosetta Stone" approach., GeoArabia, 2008, pp. 113-160.

Clerke et al., "Permeability, Relative Permeability, Microscopic Displacement Efficiency, and Pore Geometry of M_1 Bimodal Pore Systems in Arab D Limestone" SPE Middle East Oil and Gas show and Conference, Bahrain, Mar. 11-14, 2007, pp. 524-531, SPE 105259, Society of Petroleum Engineers.

* cited by examiner

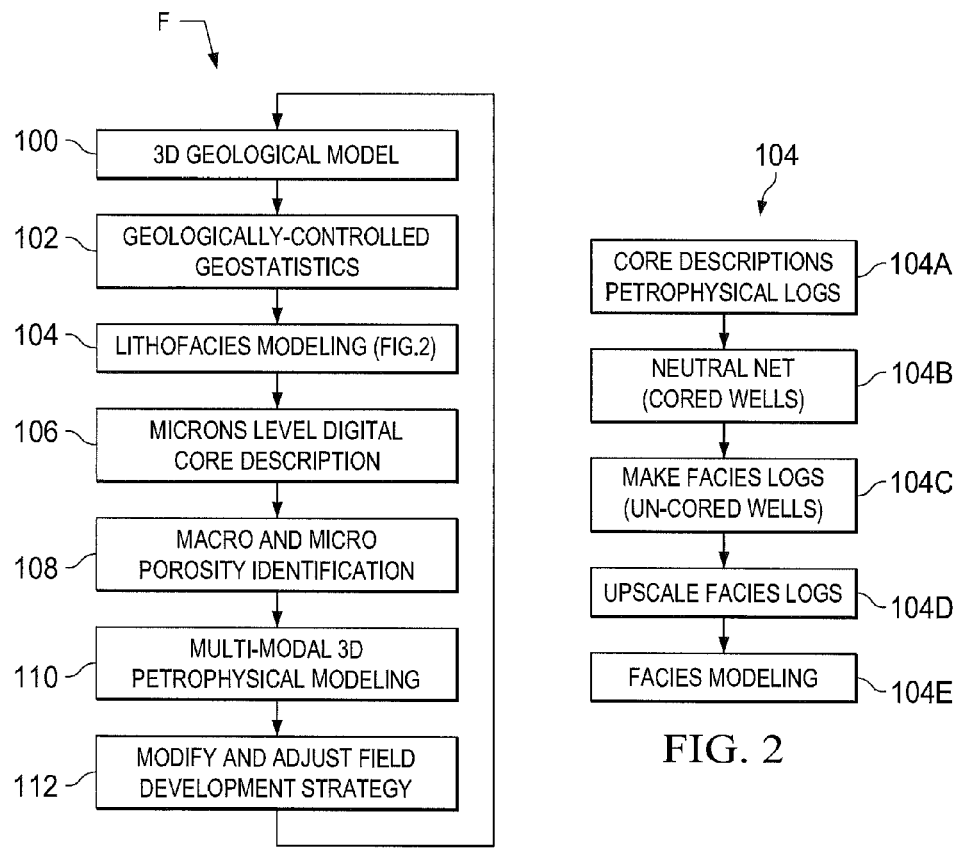

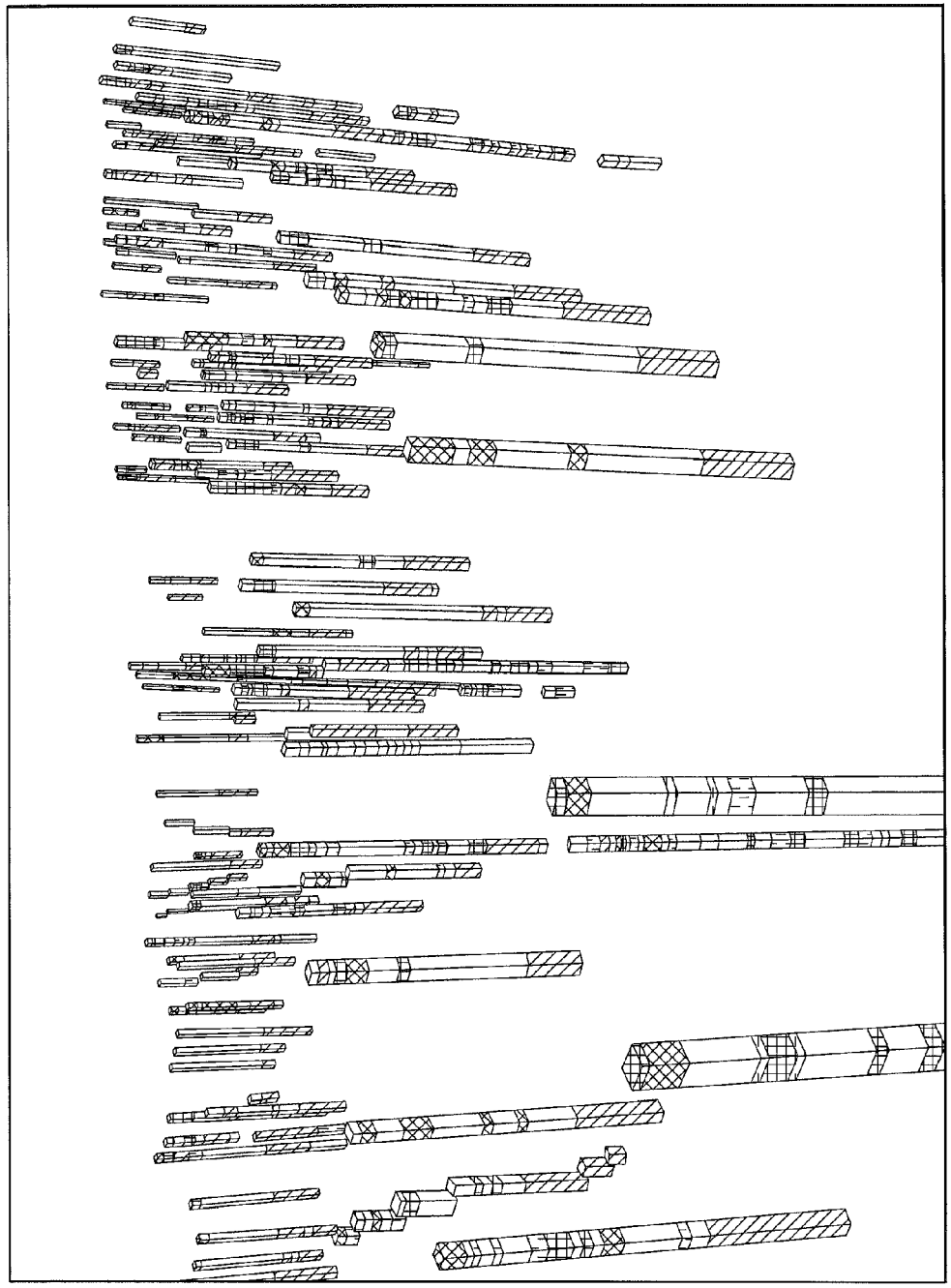

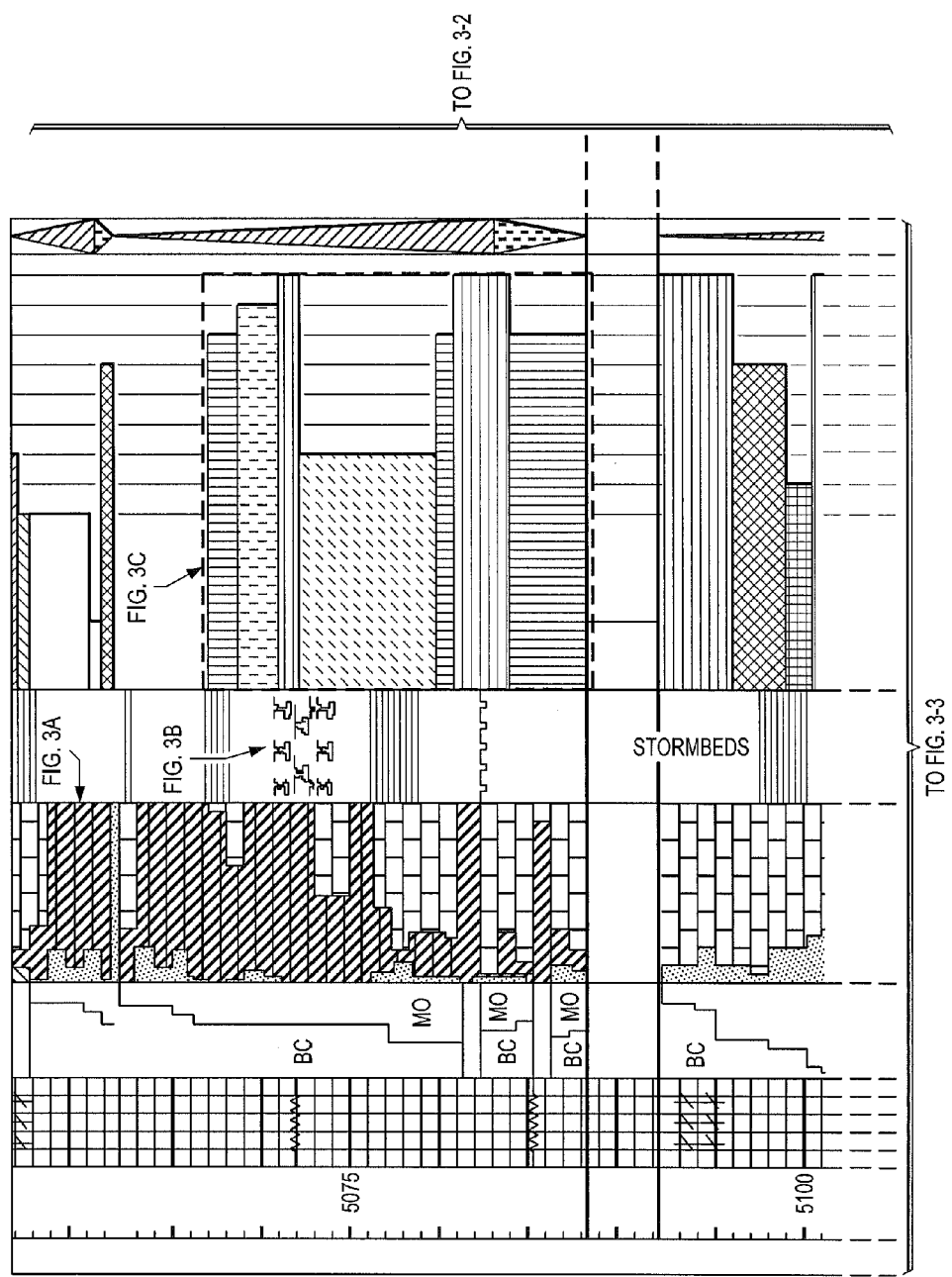

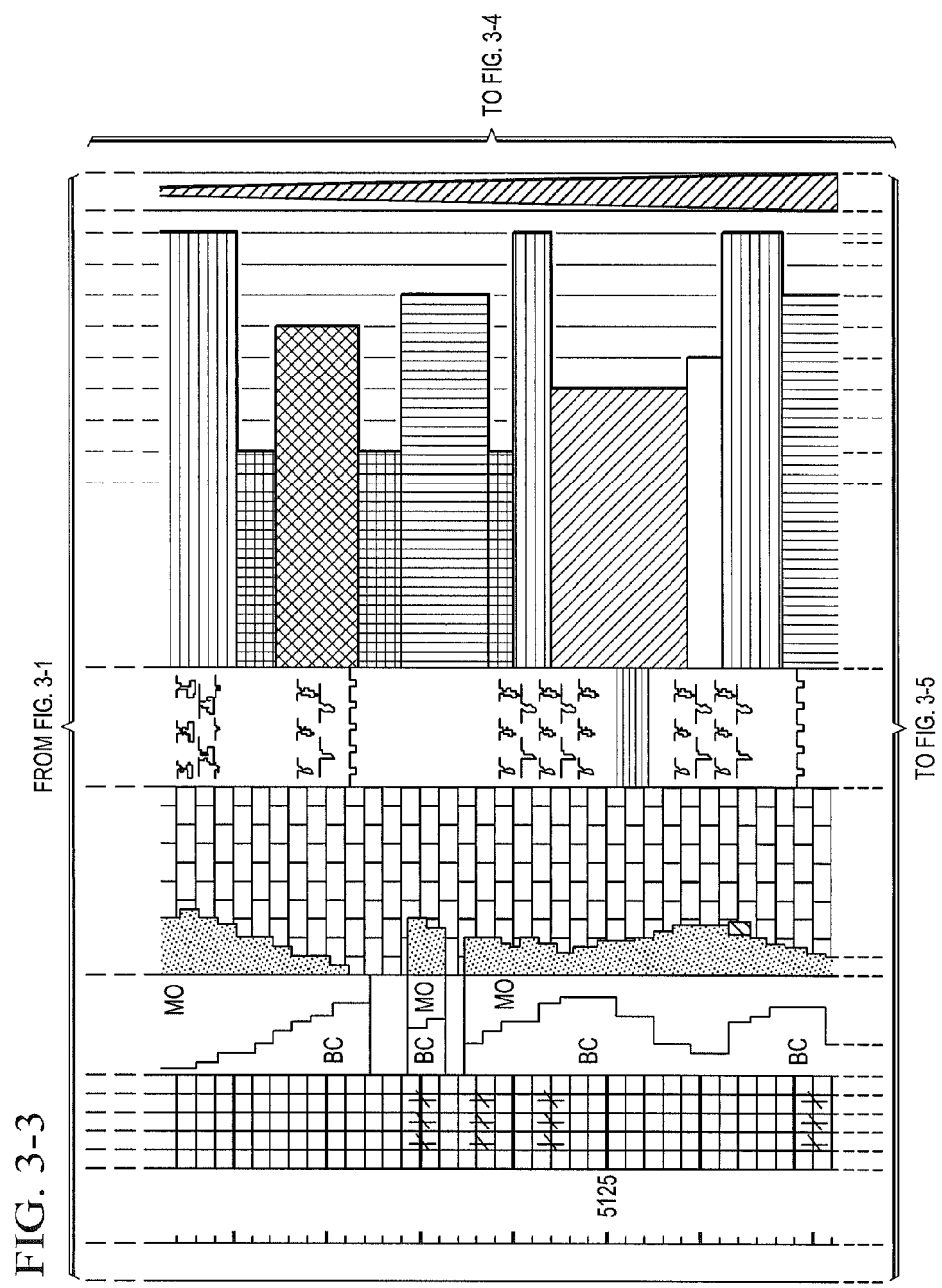

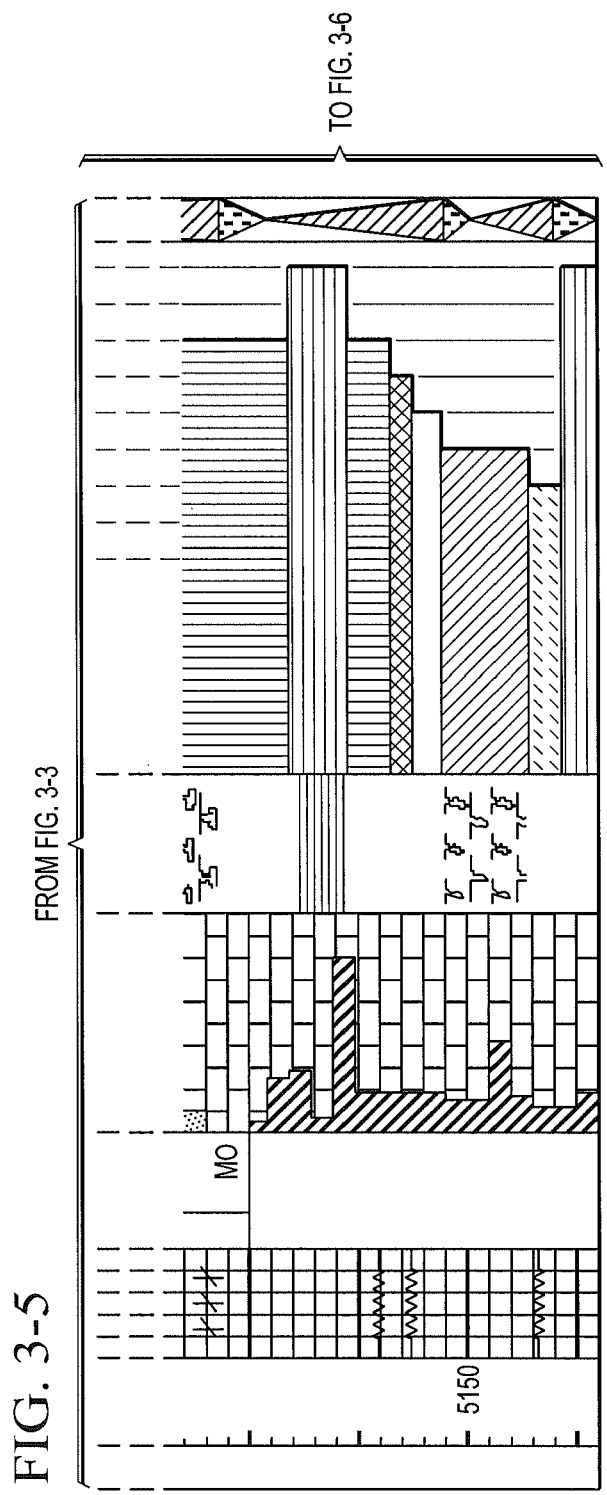

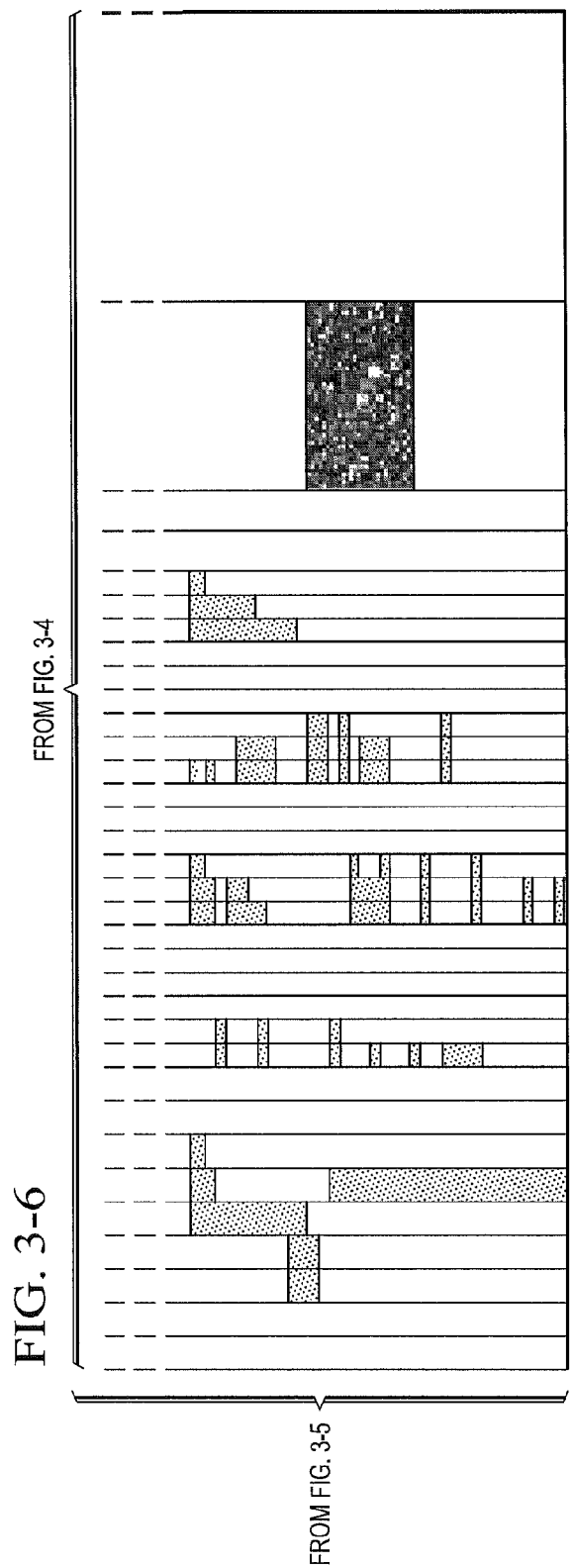

| DIGITAL LINK | | | | | |
|---|---|---|---|---|---|
| Depth | Porosity | Anhydrite | Dolomite | Limestone | No Samples |
| 5000 | 0 | 100 | 0 | 0 | 0 |
| 5001 | 0 | 100 | 0 | 0 | 0 |
| 5002 | 0 | 98 | 0 | 2 | 0 |
| 5003 | 0 | 95 | 0 | 5 | 0 |
| 5004 | 0 | 3 | 0 | 97 | 0 |
| 5005 | 0 | 80 | 0 | 20 | 0 |
| 5006 | 0 | 2 | 0 | 98 | 0 |
| 5007 | 0 | 20 | 0 | 80 | 0 |
| 5008 | 0 | 93 | 7 | 0 | 0 |
| 5009 | 0 | 95 | 5 | 0 | 0 |
| 5010 | 0 | 95 | 5 | 0 | 0 |
| 5010 | 0 | 1 | 99 | 0 | 0 |

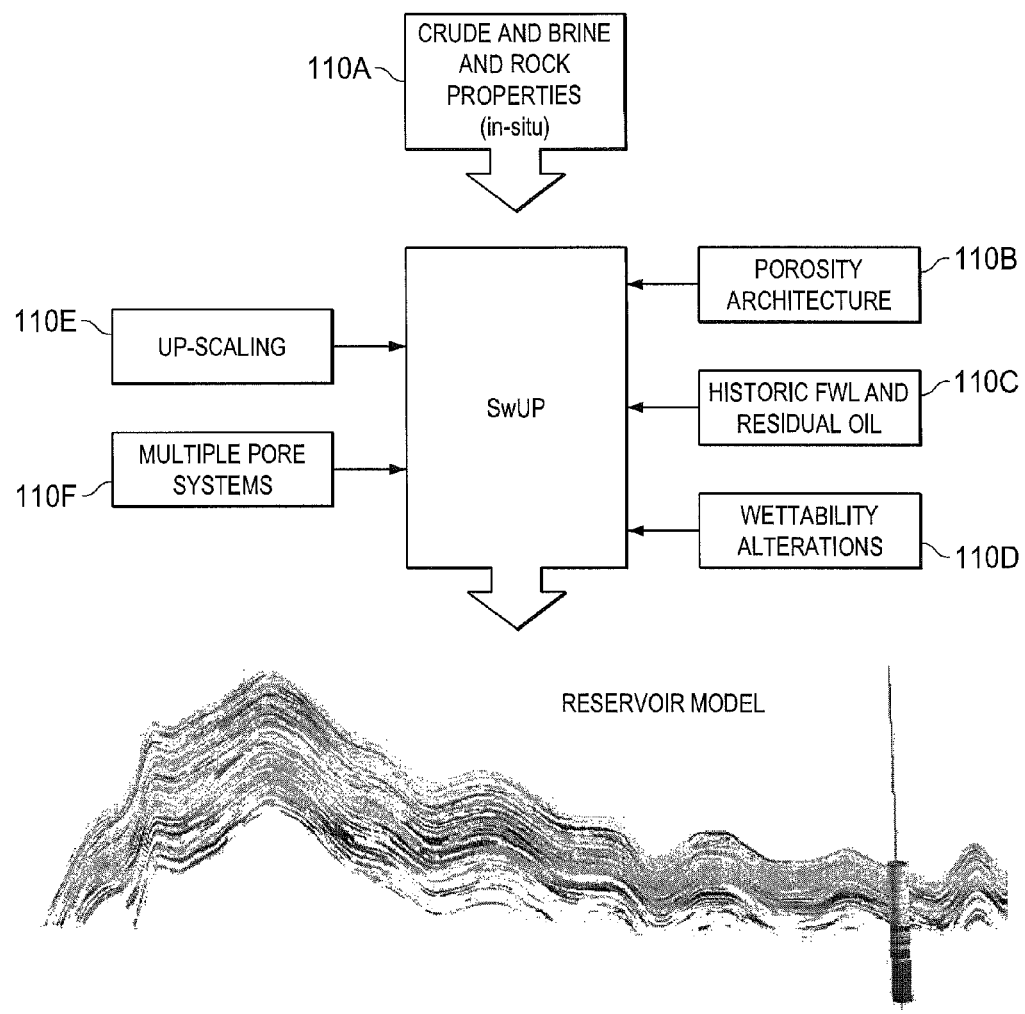

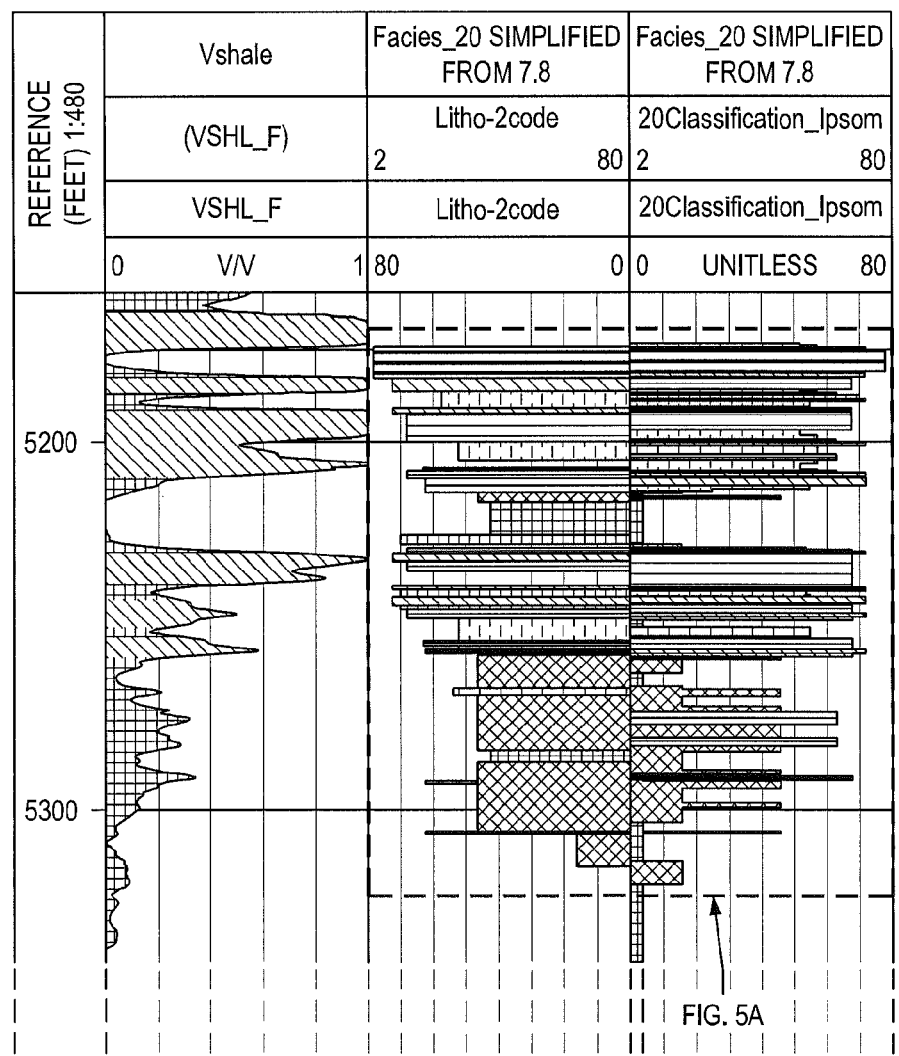

THREE-DIMENSIONAL MULTI-MODAL CORE AND GEOLOGICAL MODELING FOR OPTIMAL FIELD DEVELOPMENT

CROSS REFERENCE TO RELATED APPLICATIONS

This application claims priority from U.S. Provisional Application No. 61/640,790, filed May 1, 2012. For purposes of United States patent practice, this application incorporates the contents of the Provisional Application by reference in entirety.

BACKGROUND OF THE INVENTION

1. Field of the Invention

The present invention relates to computerized simulation of petrophysical structure of hydrocarbon reservoirs in the earth, and in particular to determination of petrophysical models of the reservoir based on core samples from wells in the reservoir and other field data regarding the reservoir.

2. Description of the Related Art

In the oil and gas industries, the development of underground hydrocarbon reservoirs typically includes development and analysis of computer simulation models. These underground hydrocarbon reservoirs are typically complex rock formations which contain both a petroleum fluid mixture and water. One form of such reservoir model has been what is known as reservoir attributes models. For these models, the reservoir has been organized into a 3-dimensional grid of cells.

Oil and gas companies have also come to depend on geological models as an important tool to enhance the ability to exploit a petroleum reserve. Geological models of reservoirs and oil/gas fields have become increasingly large and complex. In geological models, the reservoir is also organized into a 3-dimensional grid of a number of individual cells.

Seismic data with increasing accuracy has permitted the cells in reservoir models of both types to be on the order of 25 meters areal (x and y axis) intervals. For what are known as giant reservoirs, the number of cells are the least hundreds of millions, and reservoirs of what is known as giga-cell size (a billion cells or more) are encountered.

Days or weeks of computer processing have are usually been spent on 3D model attributes computations. However, the guiding geological facies were not well digitally integrated into the model. Billions of cell attributes calculations could be wasted due to inappropriate algorithms from the initial model guide.

When characterizing and developing a reservoir field, a 3D geological model of the reservoir covering the entire 3D reservoir has been required to be built to provide an accurate model for reservoir planning Accurate indications of lithofacies are an essential input in a 3D geological modeling system. Lithofacies is based on data from wells and establishes as a basis to predict reservoir properties in cells with no well data. One of the sets of data available has been what is known are formation rock descriptions or characterizations which are made by analysts based on observations made from well core samples.

Traditionally, well core data has been assembled and analyzed based on measurements and observations taken from well core samples obtained from formation rock adjacent well boreholes at a number of depths of interest in a well. So far as is known, the core description has been hand drawn and was thereafter available for use in the form of a paper copy or at best a scanned graphical image of the hand drawing. The important geological information for a reservoir model came in a wide variety of forma and formats. This information included numerical information, text strings, graphical images, relationships and drawings. These have posed a challenge to incorporation into the reservoir model in a form that could be consistently manipulated with other data.

In addition, manual preparation of these types of well description data presented a tedious challenge in drawing standardized patterns of mineral composition, texture, sedimentary structures based on well core samples repeatedly throughout the length of the well bore. Correlating core description data among different wells which had been described by different people with different scale and size hand drawings was also often problematic. An accurate representation of the exact shape and size of formation rock features of interest in the drawing for tens of occurrences and over several wells in a reservoir was difficult to obtain in a reliable and representative manner.

The images or sketches of well core data descriptions did not lend themselves to digital interpretation and modeling applications. These images were frequently scanned as graphics image files for subsequent use, but an analyst was still provided with a visual image indicating well core data descriptions based on original analysis and formatting of such information. The images could only be displayed in the form of a visual reference picture or image.

It has been recognized that formation rock in hydrocarbon reservoirs exhibits two levels of porosity, which have been identified as macroporosity and microporosity. Oil flow characteristics in the rock are markedly different based on the relative presence of macroporosity and microporosity. The identification and relative presence of each of these levels of porosity in the reservoir rock has been based on analysis and laboratory measurement of core samples from wells in the reservoir, especially Type 1 microporosity which is charged with oil. This is described by Clerke et al. GeoArabia 2008, Vol. 13, No. 4, Application of Thomeer Hyperbolas to Decode the Pore Systems, Facies, and Reservoir Properties of the Upper Jurassic Arab D Limestone, Ghawar Field, Saudi Arabia: A "Rosetta Stone" Approach; and Clerke, SPE Journal 2009, Permeability, Relative Permeability, Microscopic Displacement Efficiency, and Pore Geometry of M_1 Bimodal Pore Systems in Arab D Limestone. The identification of the porosity level presence was linked to an understanding of the rock space architecture.

Micron level core analysis, while accurate, generally lacked the integration to the rest of the digital interpretation and modeling applications and systems. Hydrocarbons recovered from macroporosity have proven to be usually much larger than the microporosity-recovered volumes in the early years of field recovery. This has led to an imprecise and inaccurate forecast of the field ultimate recovery, i. e., the performance of the microporosity hydrocarbons has not been properly included.

Existing geological modeling processes and applications have not satisfactorily taken into account the formation rock characteristic data and the porosity level presence indicated by core samples. Specifically, proper pore system and recovery process data has, so far as is known, rarely been acquired in sufficient statistical quantities and in appropriate coordination with the geological facies.

SUMMARY OF THE INVENTION

Briefly, the present provides a new and improved computer implemented method of forming with a computer system a model of petrophysical structure of a subsurface reservoir. The model is formed based on well core description data obtained from analysis of well core samples about subsurface features of rock formations adjacent well bores in the subsurface reservoir. An initial geostatistical model of spatial distribution of the petrophysical structure of the subsurface reservoir is formed based on the well core description data. A geological model of lithofacies for wells in the reservoir in which core have not been obtained is also formed. A digital core description of lithofacies of the subsurface reservoir at the well bores is obtained based on the geological model. Identifications of the presence of macroporosity and microporosity in the subsurface lithofacies are received. A model is then formed of the petrophysical structure of the reservoir based on the well core description data, the digital core description and the identified presence of macroporosity and microporosity in the subsurface lithofacies.

The present invention also provides a new and improved data processing system for computerized simulation of a model of lithofacies of a subsurface reservoir. The data processing system includes a processor which forms an initial geostatistical model of spatial distribution of the petrophysical structure of the subsurface reservoir based on the well core description data. The processor also forms a geological model of lithofacies for wells in the reservoir in which core have not been obtained, and obtains a digital core description of lithofacies of the subsurface reservoir at the well bores based on the geological model. The processor receives identifications of the presence of macroporosity and microporosity in the subsurface lithofacies, and forms a model of the petrophysical structure of the reservoir based on the well core description data, the digital core description and the identified presence of macroporosity and microporosity in the subsurface lithofacies.

The present invention further provides a new and improved data storage device having stored in a non-transitory computer readable medium computer operable instructions for causing a data processing system to form a model of petrophysical structure of a subsurface reservoir based on well core description data obtained from analysis of well core samples about subsurface features of rock formations adjacent well bores in the subsurface reservoir. The instructions stored in the computer readable medium causing the data processing system to form an initial geostatistical model of spatial distribution of the petrophysical structure of the subsurface reservoir based on the well core description data The instructions in the computer readable medium also cause the data processing system to form a geological model of lithofacies for wells in the reservoir in which core have not been obtained, and to obtain a digital core description of lithofacies of the subsurface reservoir at the well bores based on the geological model. The instructions in the computer readable medium also cause the data processing system to receive identifications of the presence of macroporosity and microporosity in the subsurface lithofacies, and to form a model of the petrophysical structure of the reservoir based on the well core description data, the digital core description and the identified presence of macroporosity and microporosity in the subsurface lithofacies.

BRIEF DESCRIPTION OF THE DRAWINGS

FIG. 1 is a functional block diagram of a set of data processing steps performed in a data processing system for reservoir geological modeling of subsurface earth formations according to the present invention.

FIG. 2C is a geostatistical variogram of results obtained during the processing steps of FIG. 2.

DETAILED DESCRIPTION OF THE PREFERRED EMBODIMENTS

Figure 2A:
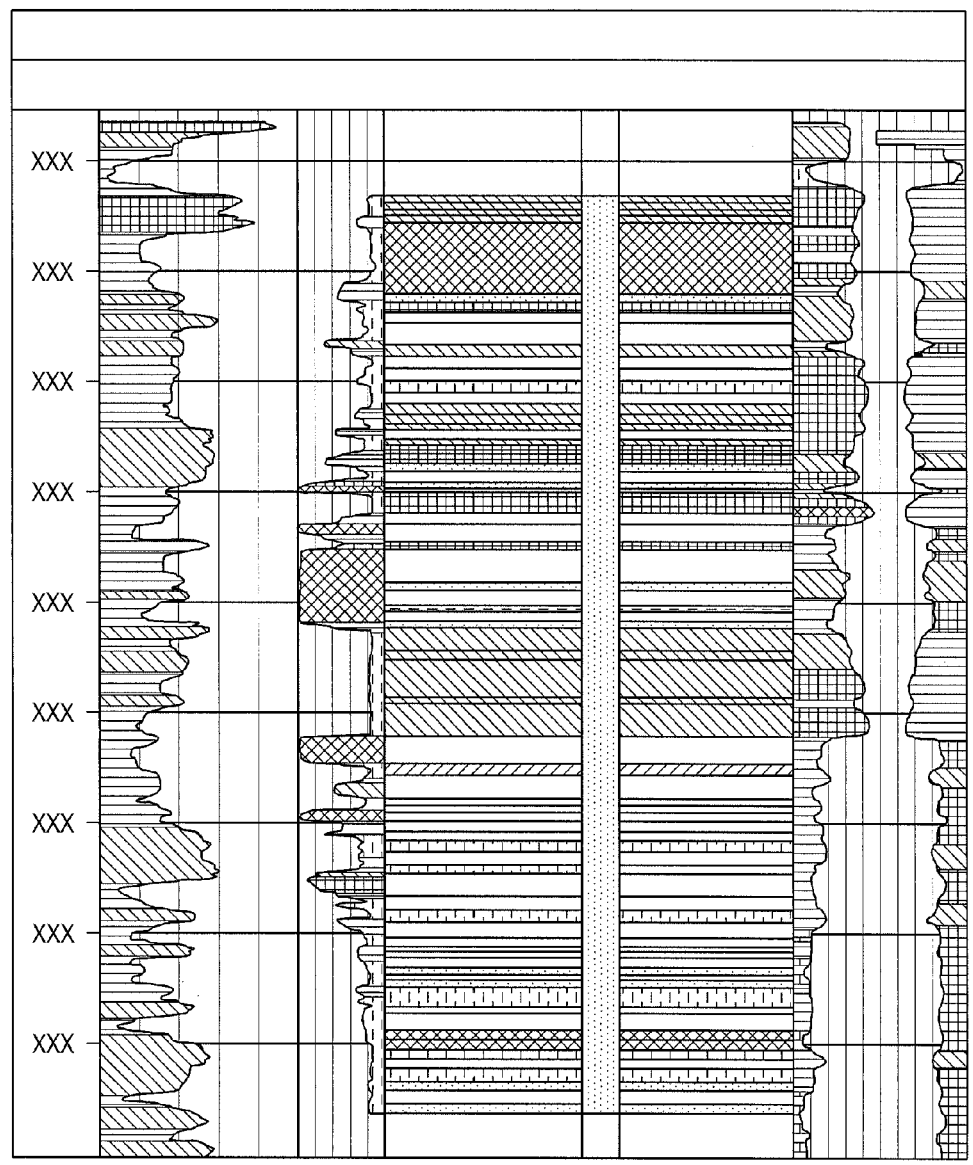
FIG. 2A is a display of data resulting from one of the processing steps of FIG. 2.

With the present invention, petrophysical properties and attributes of subsurface reservoirs are determined and modeled. The petrophysical properties provide a cumulative representation of the nature and structure of the formations in the subsurface reservoir. The model so formed is based on the pertinent geological facies, derived from well core description and detailed studies of rock, as well as fluid and pore properties (Full Pore System) obtained from laboratory analyses of core material and well log data. These data differentiate various important pore throat and pore body regions and relationships, i.e., Macroporosity, and Type 1, 2 and 3 micropores.

The present invention thus provides an understanding of hydrocarbon volumes in the various pore type groups, which allows the establishment of proper recovery techniques through focused laboratory studies. This yields a field development strategy that can significantly increase hydrocarbon recovery from a reservoir.

As will be set forth, the present invention begins with 3-dimensional geo-cellular models of giant reservoirs with facies and full pore system attributes. Determinations are then made using pore system type guidance from digitally described cores and rock core plugs to the sub-micron level, and identification and categorization of the macroporosity and multiple microporosity types. Multi-modal 3-dimensional modeling programs can then be used to form output models of the petrophysical properties and attributes of subsurface reservoirs. The processing results of the present invention contribute to optimal macro-micro reservoir recovery strategy and can lead potentially to billions of barrels of production in improved reservoir recovery.

The attributes may be for example water saturation, porosity and permeability, and are determined directly at each cell of a three dimensional grid of a subsurface hydrocarbon reservoir. Input parameters based on original data from petrophysical measurements and other attributes of the reservoir and its subsurface features are generated for the individual cells. The processing of inputs for petrophysical properties and attributes is implemented by a suitable data processing system. The data processing system can be a mainframe computer of any conventional type of suitable processing capacity, or a cluster computer of a suitable number of processor nodes. An example of such a data processing system is a Linux Cluster arrangement which is commercially available. Other digital processors, however, may also be used, such as a laptop computer, or any other suitable processing apparatus. It should thus be understood that a number of commercially available data processing systems be used for this purpose.

A flowchart F (FIG. 1) indicates the basic computer processing sequence of the present invention and the cluster computation taking place for a reservoir property or attribute according to the present invention. The processing sequence of the flow chart F is performed separately for each reservoir petrophysical property or attribute of the formations of interest in the reservoir being modeled.

3D Geological Model (Step 100): Step 100 is performed by assembling an existing geological model for processing according to the present invention. The general parameters read in during step 100 initially include the following: rock type, porosity for rock type, well pore entrance size, individual cell dimensions and locations in the x, y and z directions; petrophysical measurements and known data values of parameters and attributes from core sample data; and data available from well logs in areas of the reservoir where actual data have been obtained. The reservoir data is organized into a 3-dimensional (x, y, z) grid of cells according to the dimensions and volume of the reservoir. Depending on the size of the reservoir, the number of cells in the model can be a billion or more. Once data modeling begins, and additional data is obtained from newer wells in the reservoir and other data sources, the existing 3-dimensional petrophysical model data is supplemented by the additional data which is then included and used as part of the existing geological model.

Geologically-Controlled Geostatistics (Step 102): During step 102, geostatistical modeling is performed. The focus of the processing is to provide a geostatistical model of the postulated spatial distribution of presence of lithofacies over the entire reservoir based on the existing lithofacies data from cored wells in the geological model from step 100. The processing during step 102 uses the existing lithofacies data and forms a geostatistical model. Selected values for the geological features of interest chosen by a geologist or analyst from the existing lithofacies data are used in the geostatistical processing. For different geological facies in the reservoir, the geologist may apply different geostatistical modeling criteria or a different processing schema. In this way the geologist may control the modeling based on geological considerations rather than having the processing governed solely on statistical or analytical methodology. There are a number of presently commercially available methods for geostatistical modeling for this purpose. An example is Roxar Object-based Modeling available from Roxar ASA of Stavanger, Norway, through Emerson Process Management of St. Louis, Mo.

Figure 2B:
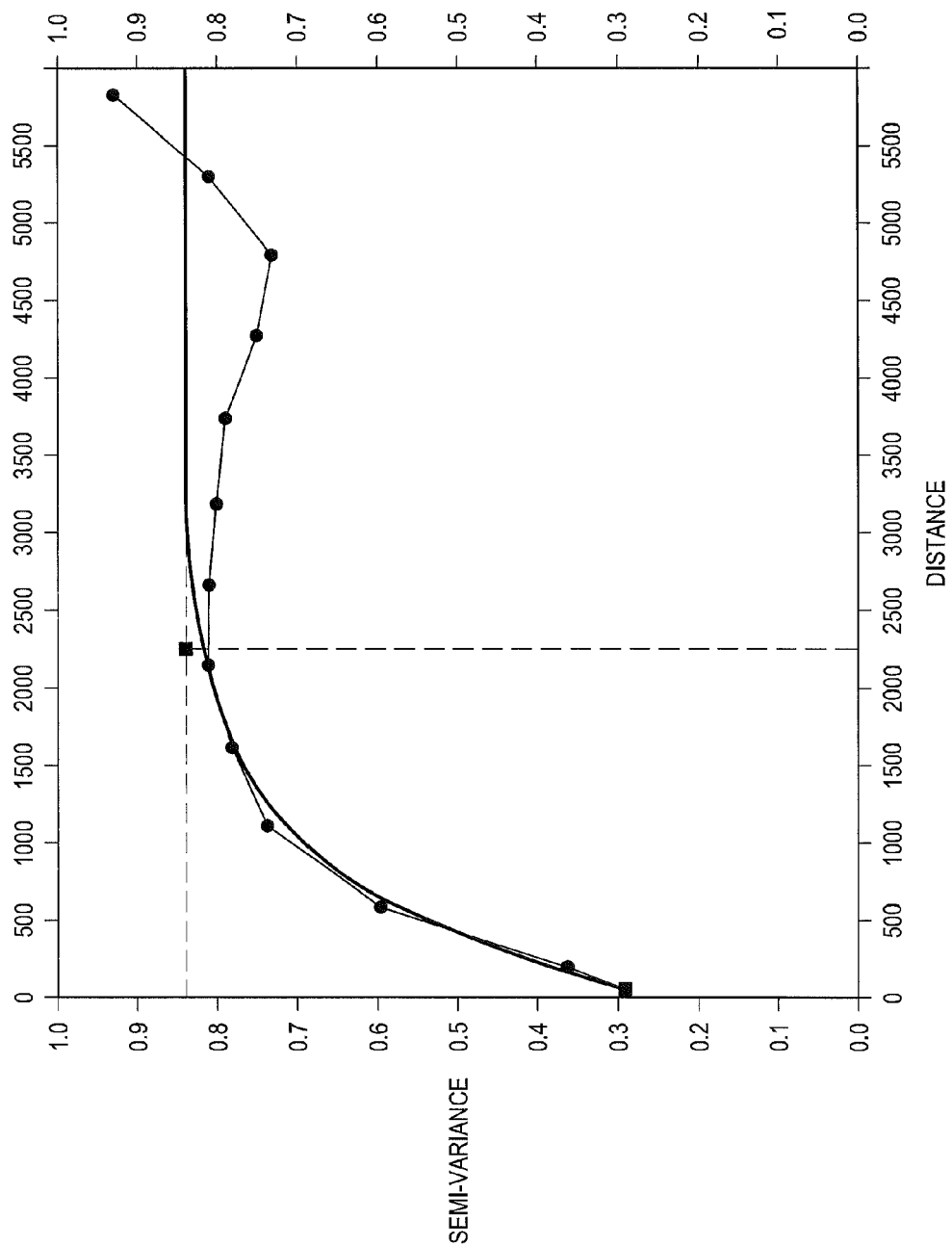
FIG. 2B is a display of data resulting from another of the processing steps of FIG. 2.
Figure 2D:
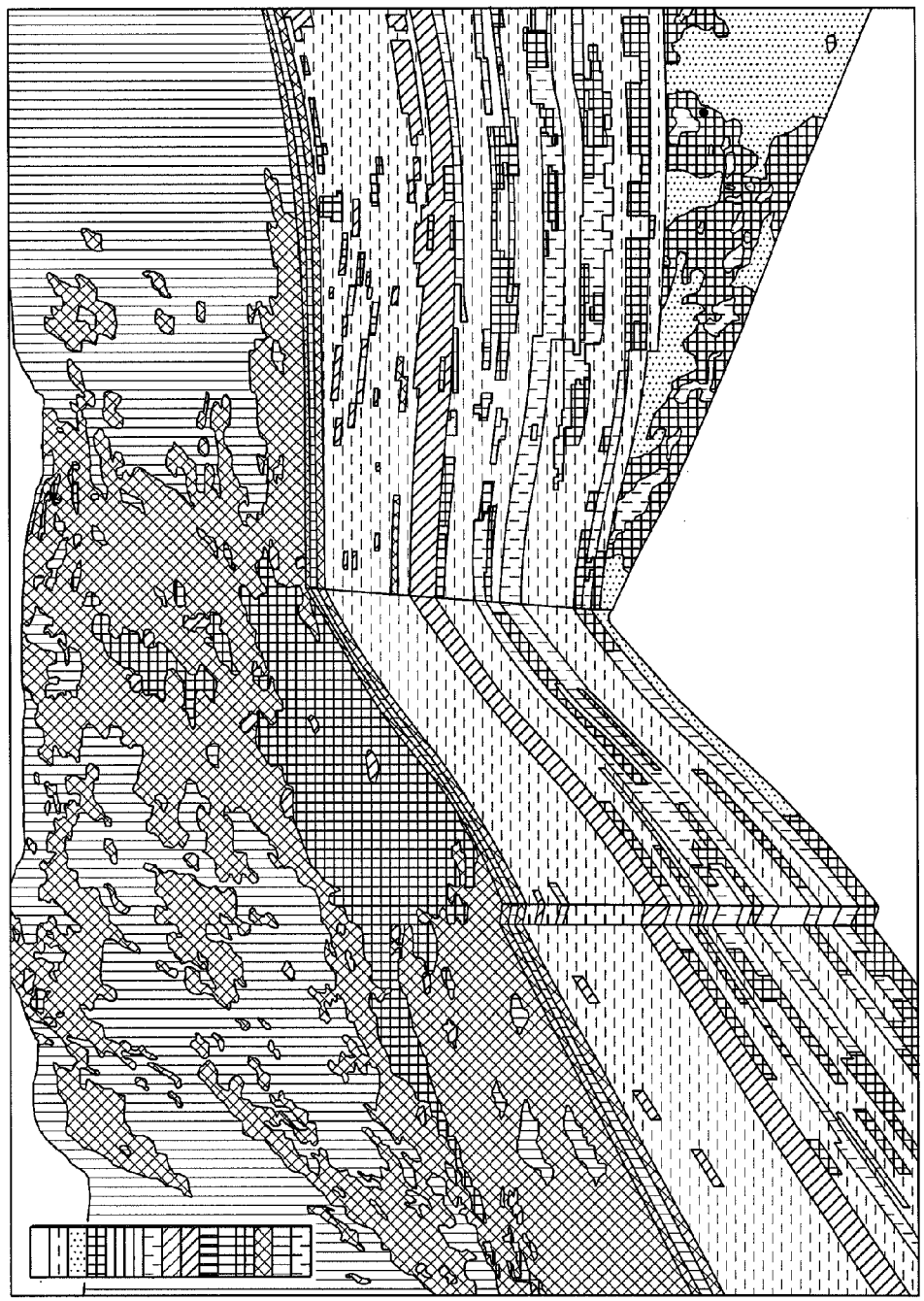
FIG. 2D example display of a 3-D geological model with facies distribution obtained during the processing steps of FIG. 2.
Figures 2, 3:
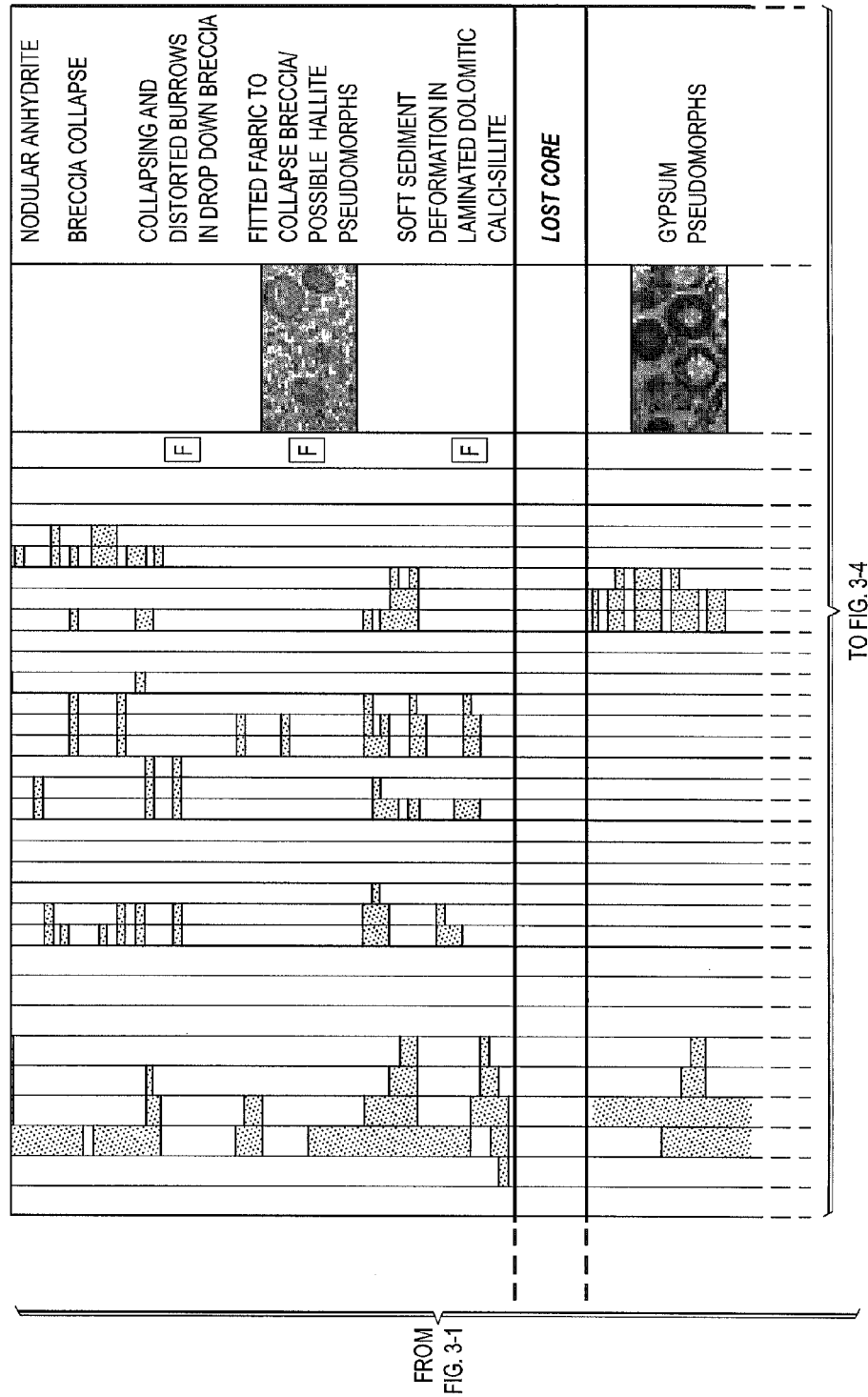
FIG. 2 is a further functional block diagram of a portion of the data processing steps of the functional block diagram of FIG. 1 for reservoir geological modeling of subsurface earth formations according to the present invention.
FIG. 3 is a display of data resulting from the digital core description processing step of FIG. 1.

Lithofacies Modeling (Step 104): During step 104, information regarding the lithofacies based on actual measurements and observations, which are termed ground truth, taken from core sample is developed. Details of the processing during step 102 are illustrated in FIG. 2. In step 104A shown in FIG. 2, processing begins with assembling petrophysical log data such as that shown in the display of FIG. 2A from the core description data for an existing well in the reservoir. During step 104B, the cored well petrophysical log description data from step 104A is subjected to neural network or comparable processing of a suitable type to postulate lithofacies data for wells from which no core samples have been taken. FIG. 2B is an example geostatistical variogram developed in the model building processing of step 104B. In step 104C facies logs are formed of the neural network processing results of step 104B. FIG. 2C is a display resulting from step 104C of facies logs from uncored wells obtained during processing by step 104B. During step 104D, the facies logs developed during steps 104B are upscaled from well log scale to 3-dimensional model scale for the reservoir. During step 104E a facies model of the results from upscaling during step 104D is formed. FIG. 2D is a visualization of a 3-dimensional geological model with facies distribution formed during step 104E.

Step 106 Digital Core Description: During step 106 (FIG. 1), the processing is performed according to the procedure described in commonly owned, co-pending U.S. patent application Ser. No. 13/616,493. "Core Plugs to Giga-Cells Lithological Modeling", filed Sep. 14, 2012, naming one of applicants as co-inventor. The subject matter of this co-pending application is incorporated herein by reference. During processing in step 106 the reservoir characterization and interpretation developed during steps 102 and 104 are integrated into the digital data description.

FIG. 3 is an example display formed as result of digital core description processing during step 106. The left seven columns in FIG. 3 (Stylolites & Fractures, Pore Type, Composition & Porosity, Sedimentary Structures, Texture, Cycle/Sequence Hierarchy, Fossils) are digital core descriptions of the formation lithology. FIG. 3A is an enlarged portion of the display of FIG. 3 indicating numerical values for designated areas. FIG. 3B is an enlarged portion of a portion of FIG. 3 indicating schematically sedimentary structures of the subsurface lithology at the indicated area. FIG. 3C is an enlarged portion of a portion of FIG. 3 which indicates graphically the carbonate texture and grain size of the subsurface lithology in the indicated region. FIG. 3D is an enlarged portion of a portion of FIG. 3 indicating an example thin section image obtained from a core sample taken at an indicated from a well in the reservoir being modeled.

Figures 2, 5:
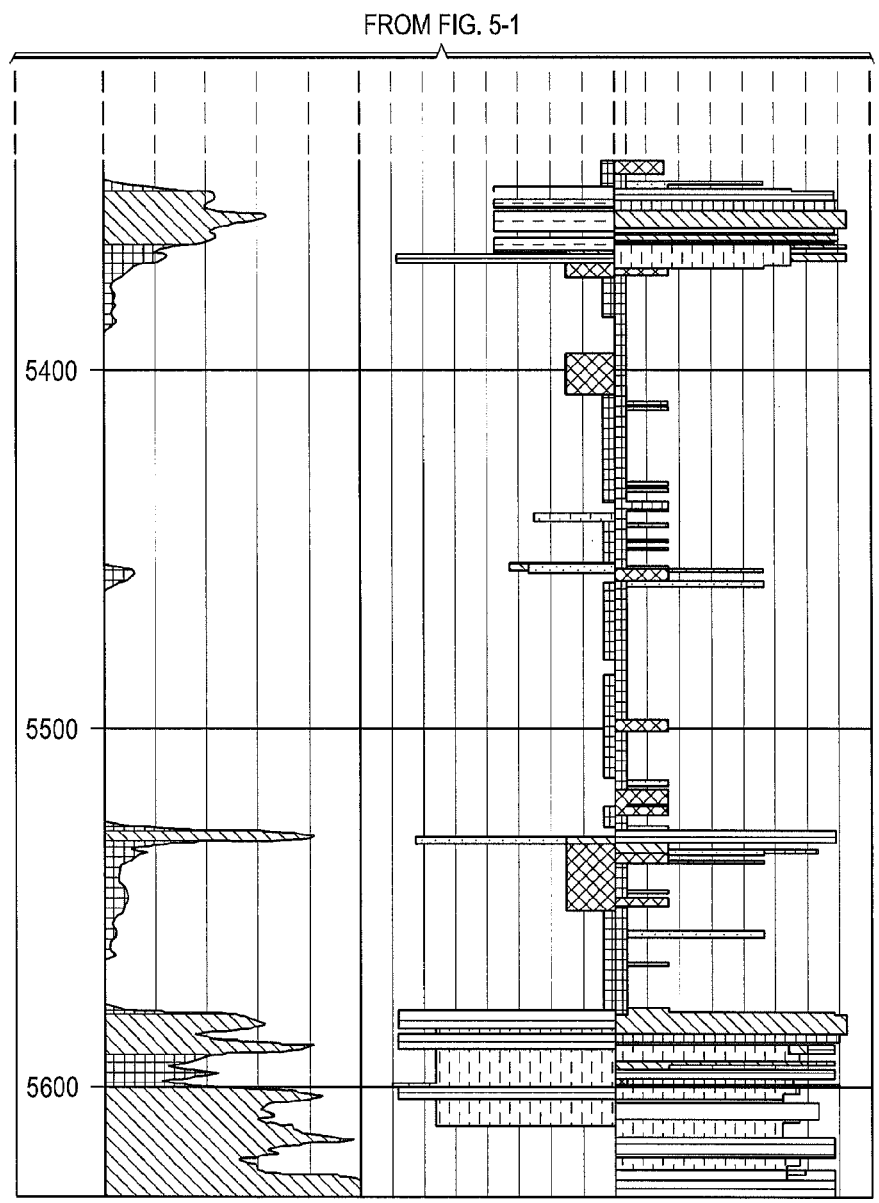
FIG. 5 is a display like that of FIG. 4A of a plot in well log format of example modeling data from processing according to the present invention.
Figure 5A:
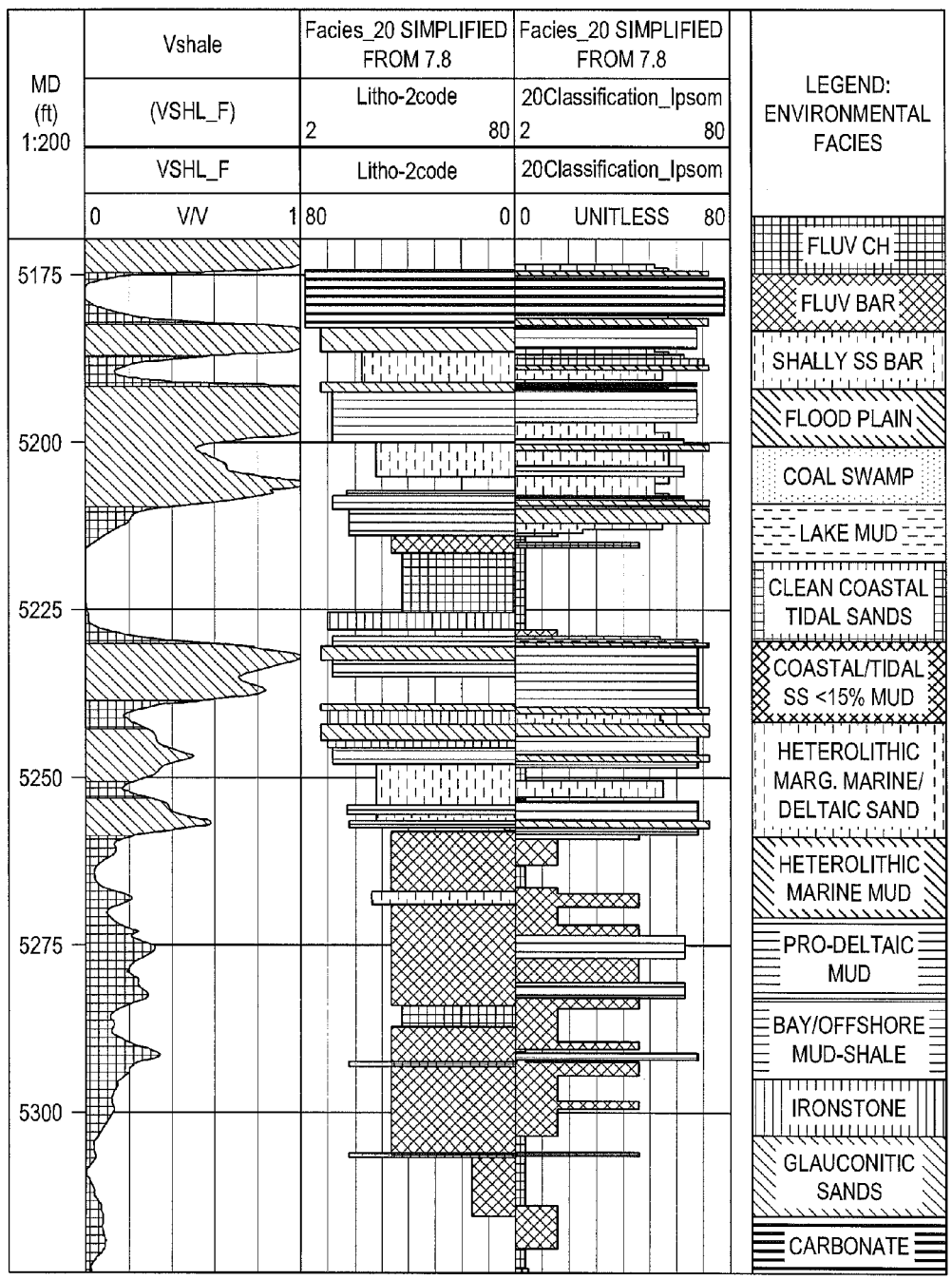
FIG. 5A is an enlarged display of portions of the data display of FIG. 5.
Figure 6A:
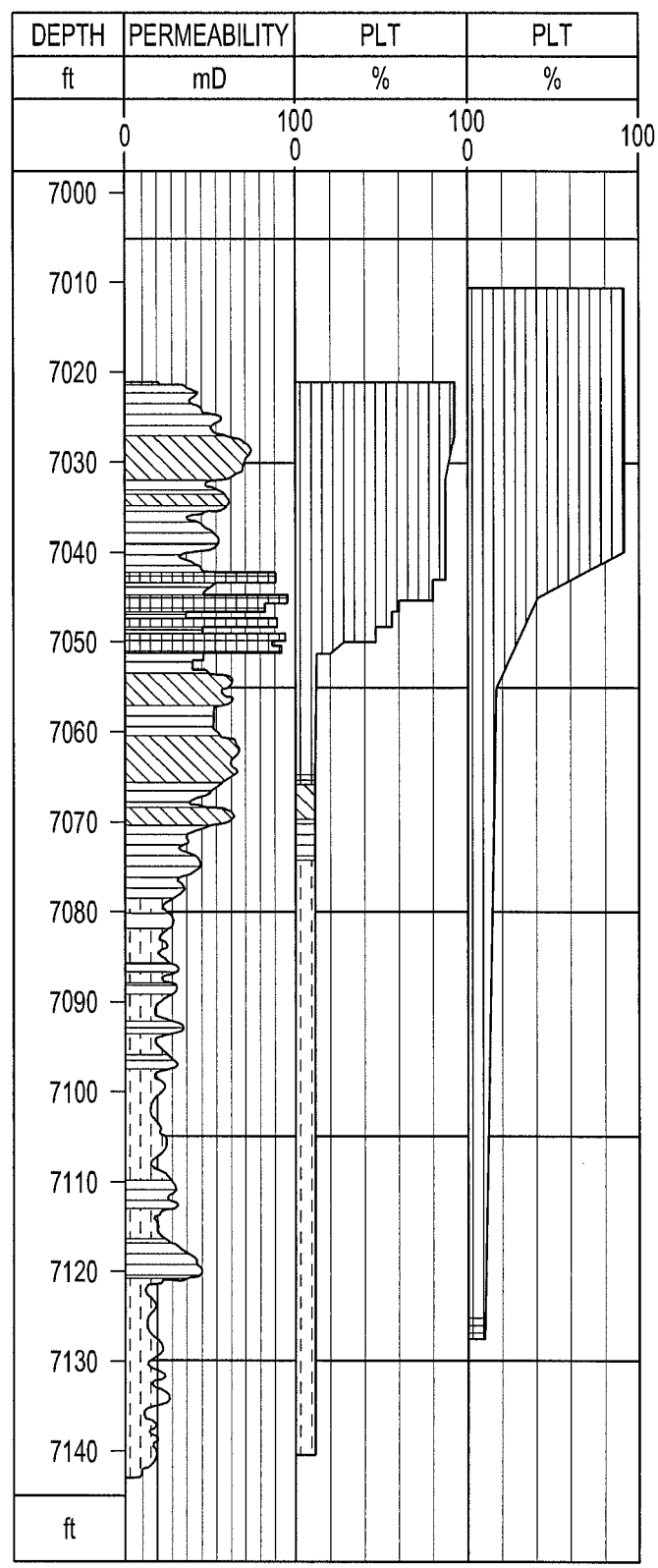
FIGS. 6A, 6B, 6C and 6D are further displays of example modeling data from processing according to the present invention.
Figure 6B:
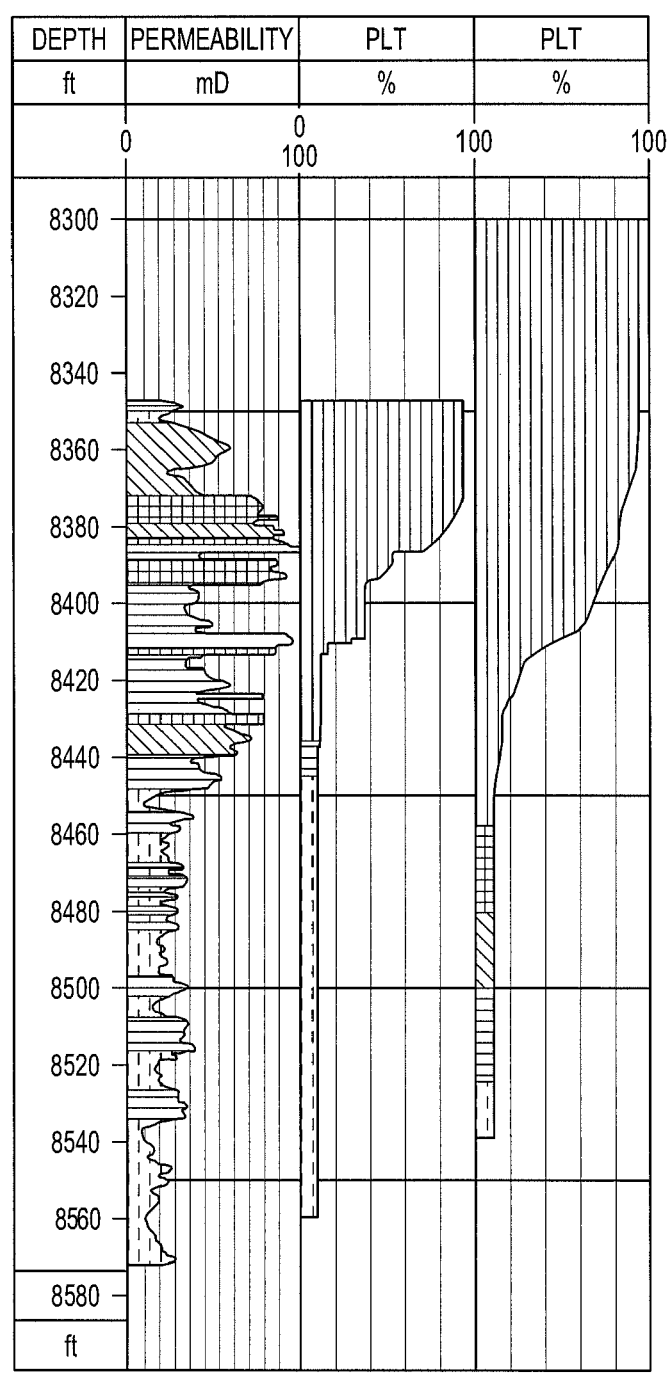
Figure 6C:
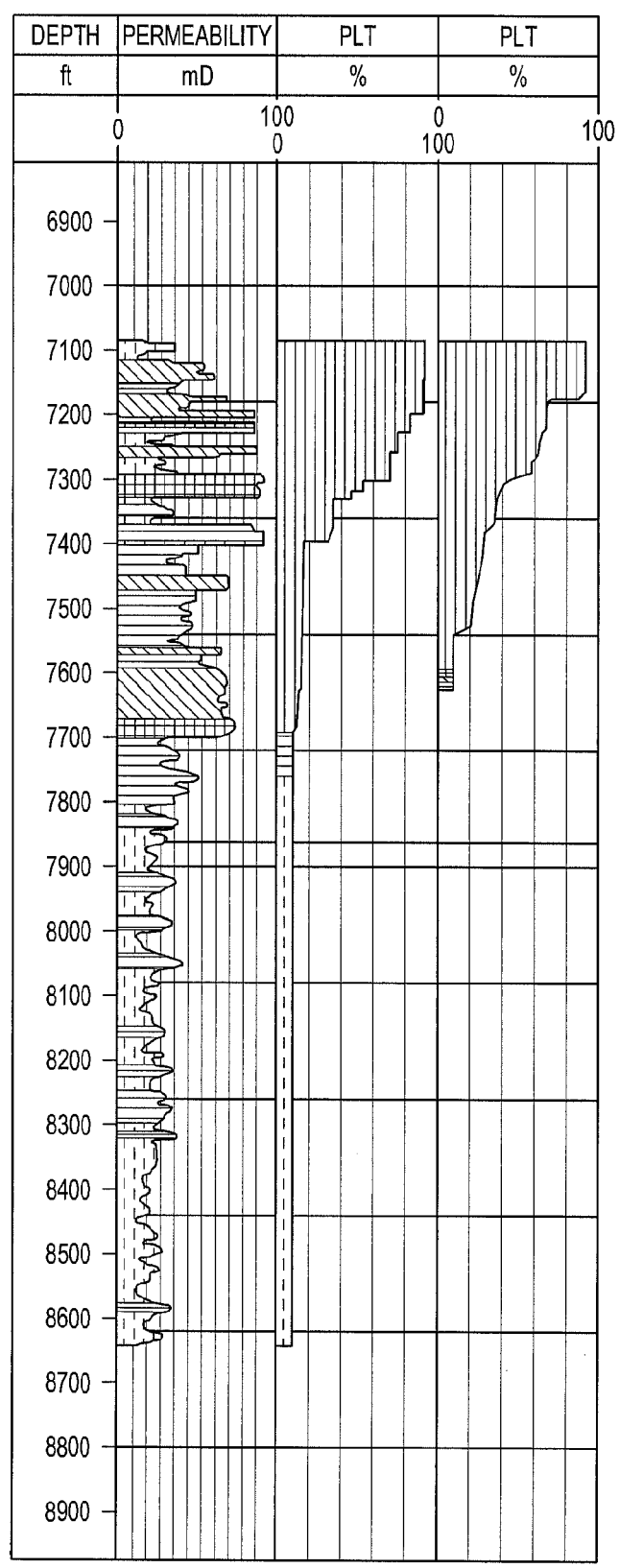
Figure 6D:
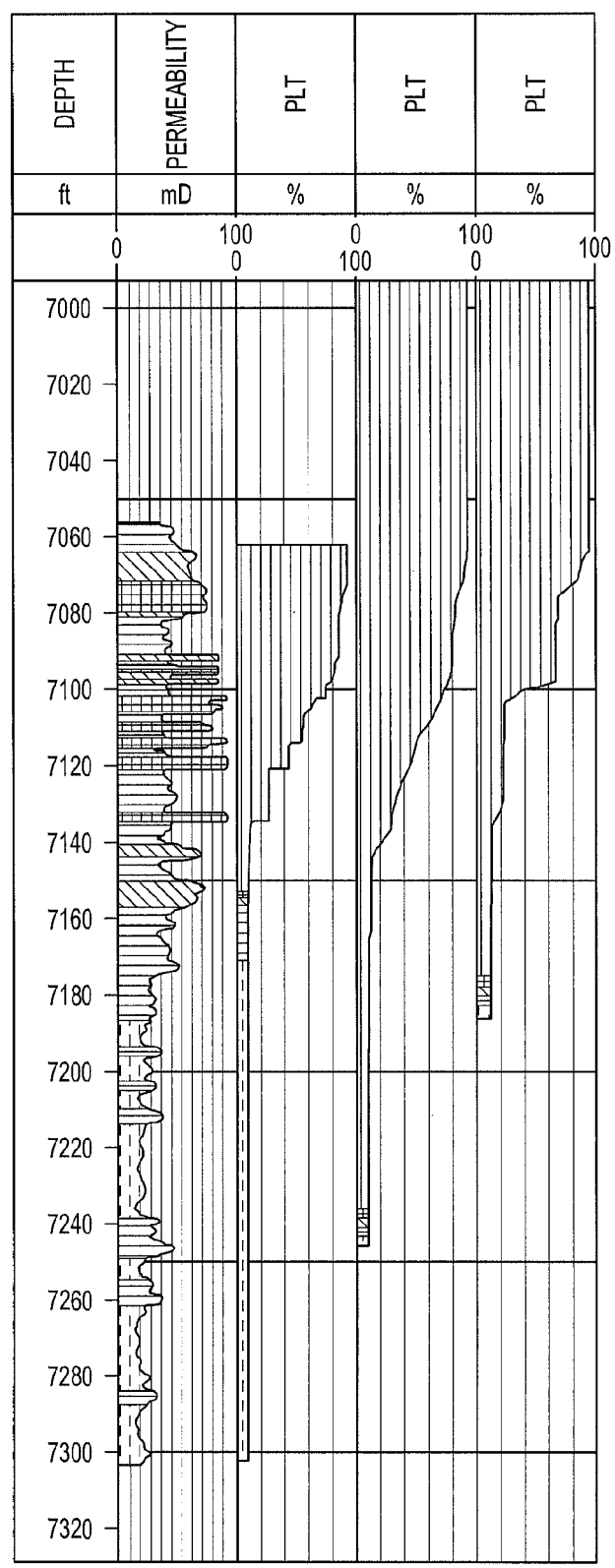

FIG. 5 is a portion of a log plot of petrophysical data from a facies log formed as a result of the processing during step 104B (FIG. 2) and FIG. 5A is an enlarged plot of a portion indicated at 5A in the plot of FIG. 5. Table I below is a replica of the legend shown at the top of FIGS. 5 and 5A identifying the facies indicated in these log plots. It should be understood that other indicia of facies may be used or included, as well.

TABLE I

Environ. Facies

Fluv Ch (Fluvial Channel)
Fluv Bar (Fluvial Bar)
Shaly SS Bar (Shaly Sand Stone Bar)
Flood Plain
Coal Swamp
Lake Mud
Clean Coastal Tidal Sands
Coastal/tidal Sand Stone <15% Mud
Heterolithic Marg. Marine/Deltaic Sand
Heterolithic Marine Mud
Pro-deltaic Mud
Bay/Offshore Mud-Shale
Ironstone
Glauconitic Sands
Carbonate FIGS. 6A, 6B, 6C and 6D are well log plots of permeability as an attribute from horizontal wells formed as a result of the processing during step 104B. These plots are wireline and fluid flow meter logs measured at wells as verification with the present invention. Plots of such attributes according to the present invention are useful and helpful information to analysts and geologists in planning for improved recovery of hydrocarbons from the reservoir.

Macroporosity and Microporosity Identification (Step 108): During step 108, the pore system architecture of the 3-dimensional geological model is analyzed and identified based on data obtained from testing of core samples. The identification and analysis may be performed, for example, according to the techniques described in a publication of the Society of Petroleum Engineers: "Permeability, Relative Permeability, Microscopic Displacement Efficiency and Pore Geometry of M_1 Bimodal Pore Systems in Arab D Limestone" Society of Petroleum Engineers Journal, SPE J. 105259 (2009) (Clerke); "Application of Thomeer Hyperbolas to Decode the Pore Systems, Facies, and Reservoir Properties of the Upper Jurassic Arab D Limestone, Ghawar Field, Saudi Arabia: A 'Rosetta Stone' Approach", GeoArabia 2008, Vol. 13, No. 4, (Clerke, et al). Investigation and analysis according to these techniques providing information about pore geometrical parameters for the geological model is conducted down to the sub-micron level. The pore system architecture analysis performed yields data regarding macroporosity (Type M) and microporosity (1, 2, and 3) properties of facies in the geological model.

Figure 7:
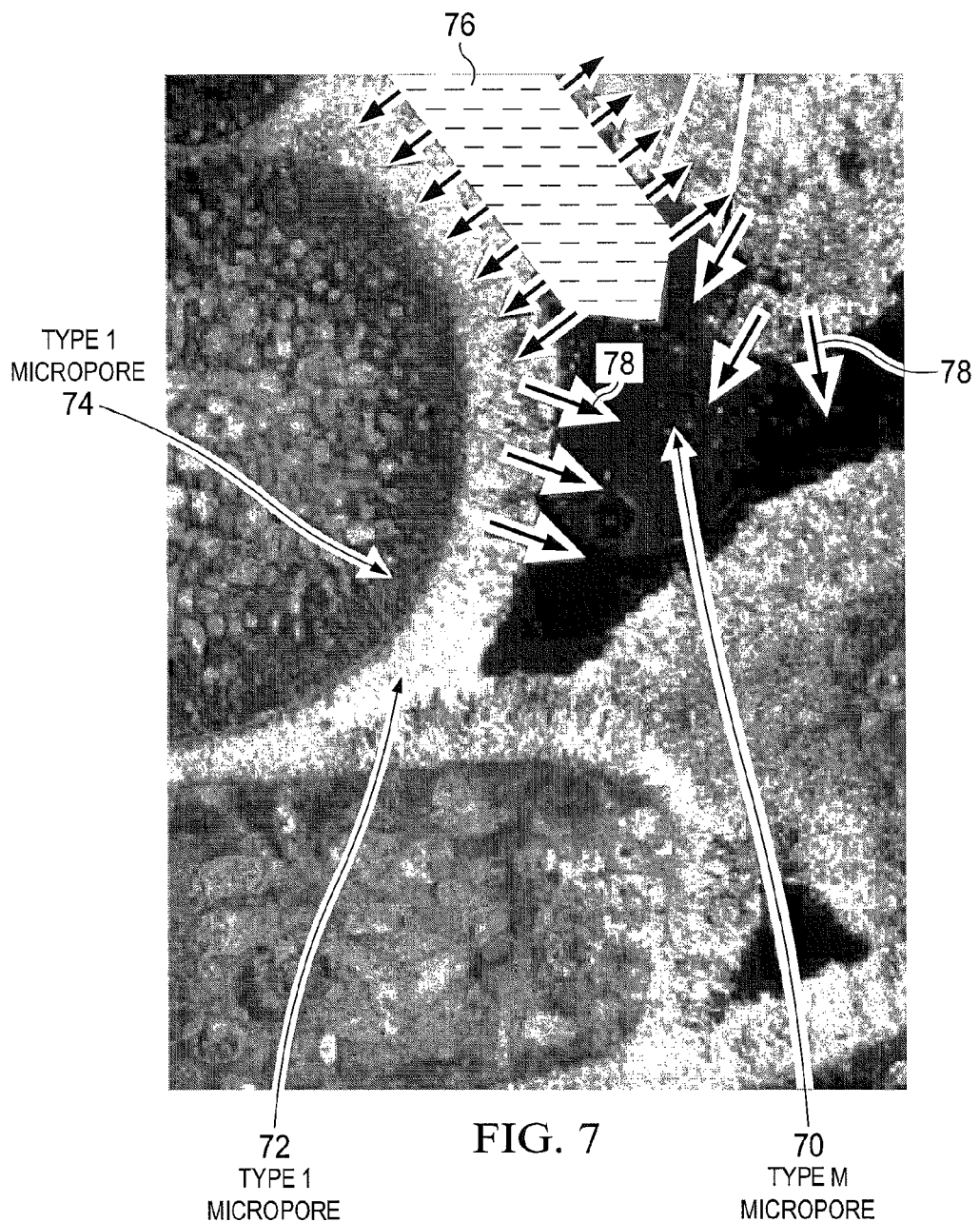
FIG. 7 is an enlarged thin section image of a portion of a core sample showing actual macropore and micropore structure.
Figure 8:
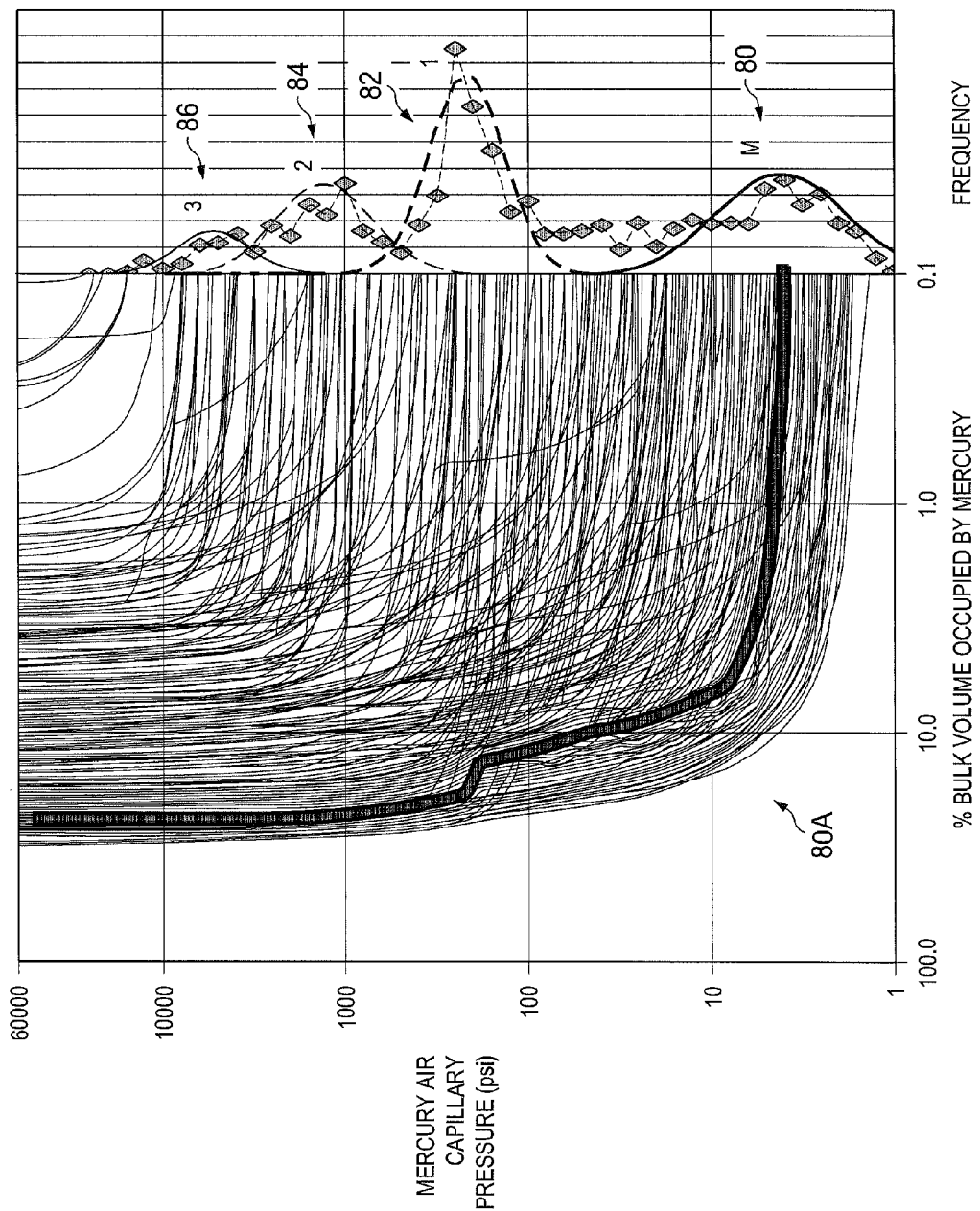
FIG. 8 is a capillary pressure curve display of measurements from laboratory of well core plugs to investigate the relative presence of macroporosity and microporosity.

In FIG. 7 macroporosity in the form of a Type M macropore in a thin section image of a lithological sample is indicated by an arrow 70, while microporosity in the form of Type 1 micropores in the sample is indicated by arrows 72 and 74. An enlarged arrow 76 indicates schematically entry of water comes in to the pore space of the sample via the macropore and paths of the water into the micropores. Arrows 78 indicate hydrocarbons movement from micropore to macropore. FIG. 8 shows the standard capillary pressure curve display of the type described in Clerke et al. GeoArabia 2008, Vol. 13, No. 4, identified above. Multiple lines indicated generally at 80A on the left portion of the display are laboratory measurements from multiple well core plugs in a reservoir. The right portion of the display in FIG. 8 shows the occurrence frequency statistical display identifying at 80 macroporosity M and at 82, 84, and 86 the respective microporosity 1, 2, and 3 properties.

Multi-Modal 3-D Petrophysical Modeling (Step 110): Petrophysical modeling of the reservoir based on the input data, the digital core description data and the identified presence of macroporosity and microporosity in the cells of the reservoir. The modeling methodology utilized is preferably a multi-modal petrophysical algorithm. The choice of modeling utilized is based in part on the attributes of interest. The modeling may be performed, for example, according to the 3-dimensional modeling methodology of the type described in co-pending U.S. patent application Ser. No. 13/913,086, "Cluster Petrophysical Uncertainty Modeling", filed Jul. 28, 2011, naming one of applicants as co-inventor.

The petrophysical models formed during step 110 may be of a number of forms. The models may be models of petrophysical structure, such as facies logs of the type shown in FIGS. 5 and 5A; and facies models of the type shown in FIG. 2D. The models of petrophysical properties may also be of reservoir attributes, either in log plot form (FIGS. 6A through 6D, inclusive) or in 3-dimensional form as shown in FIG. 4B described below.

Figures 3, 4:
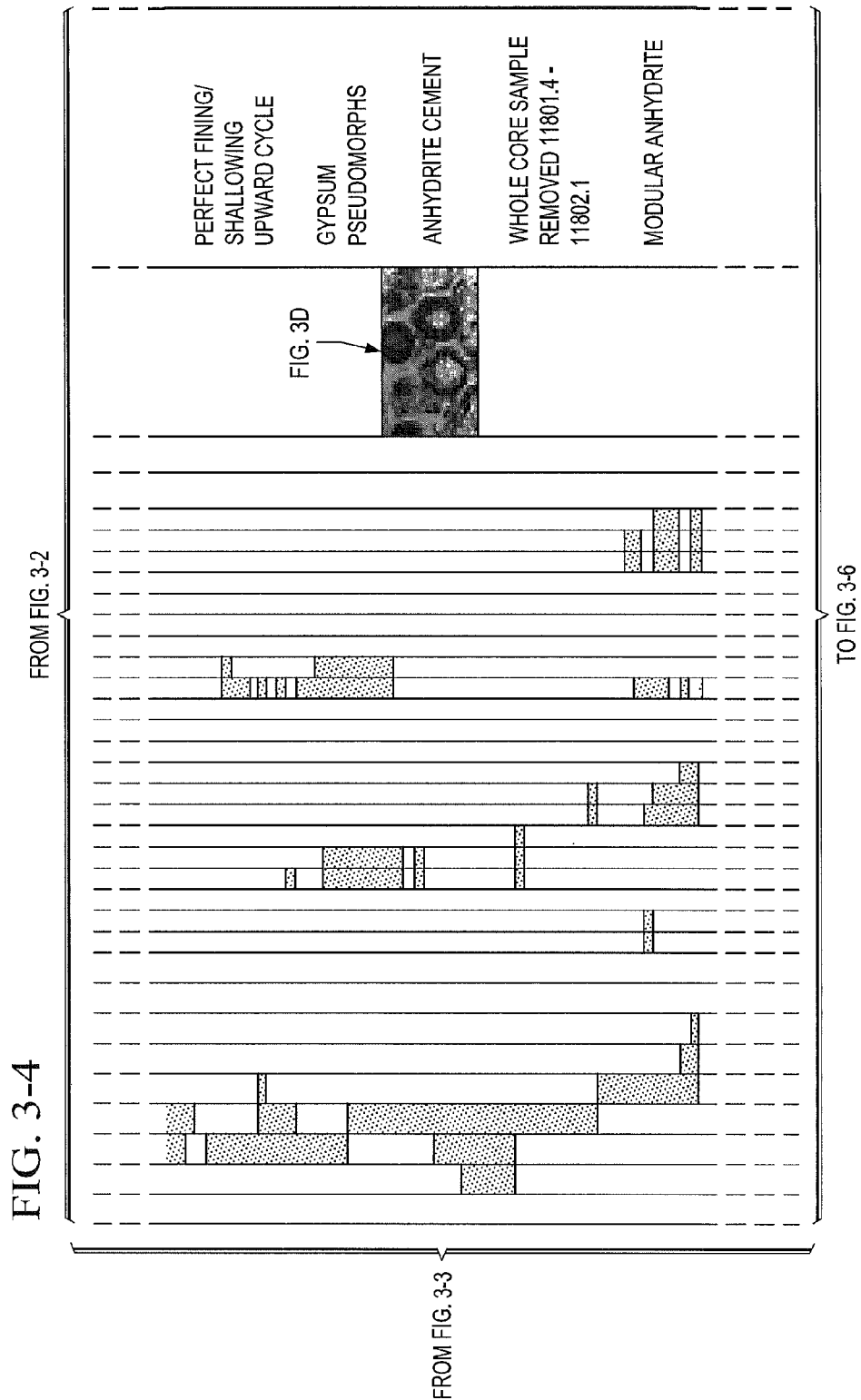
FIG. 4 is a schematic diagram of inputs used in upscaling water saturation in processing according to the present invention.
Figures 3A, 3B:
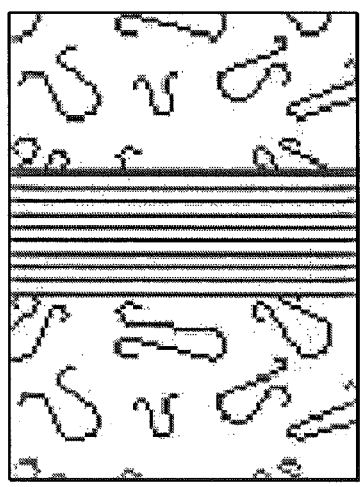
FIGS. 3A, 3B, 3C and 3D are enlarged displays of portions of the data display of FIG. 3.
Figure 3C:
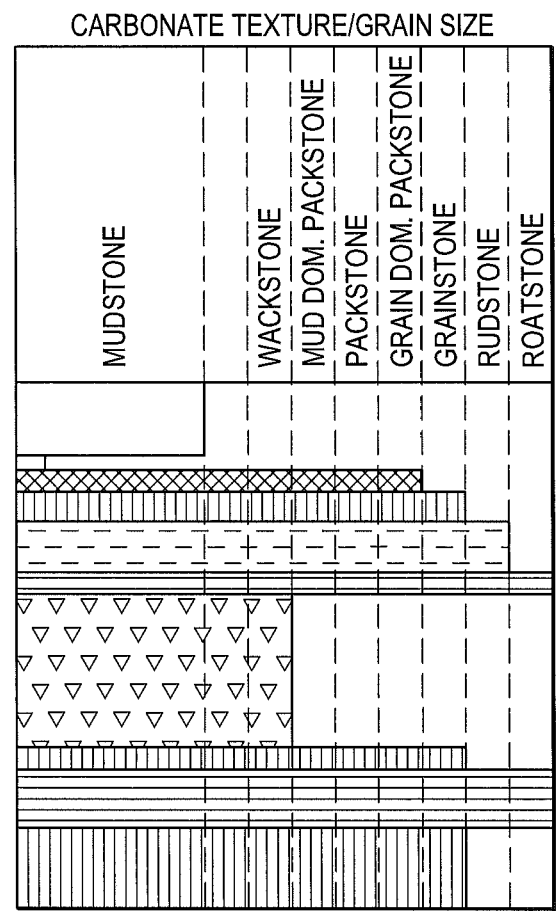
Figure 3D:
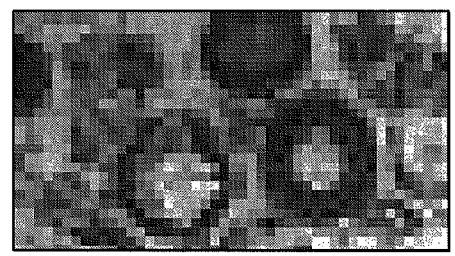

FIG. 4 illustrates schematically an example procedure for determining values for upscale water saturation $S_wUP$ as a reservoir attribute according to the present invention. Input parameters including: crude, brine, and rock properties in-situ as indicated at 110A; porosity architecture 110B; historical free water level and residual oil data 110C; wettability alterations 110D; as well as parameters indicating the nature of upscaling 110E; and the nature and presence of multiple formation pore systems 110F are provided to the data processor, along with the petrophysical processing algorithm for determining upscale water saturation. A display of modeling results of a reservoir attribute, such as upscale water saturation $S_wUP$, is then formed.

Figure 4A:
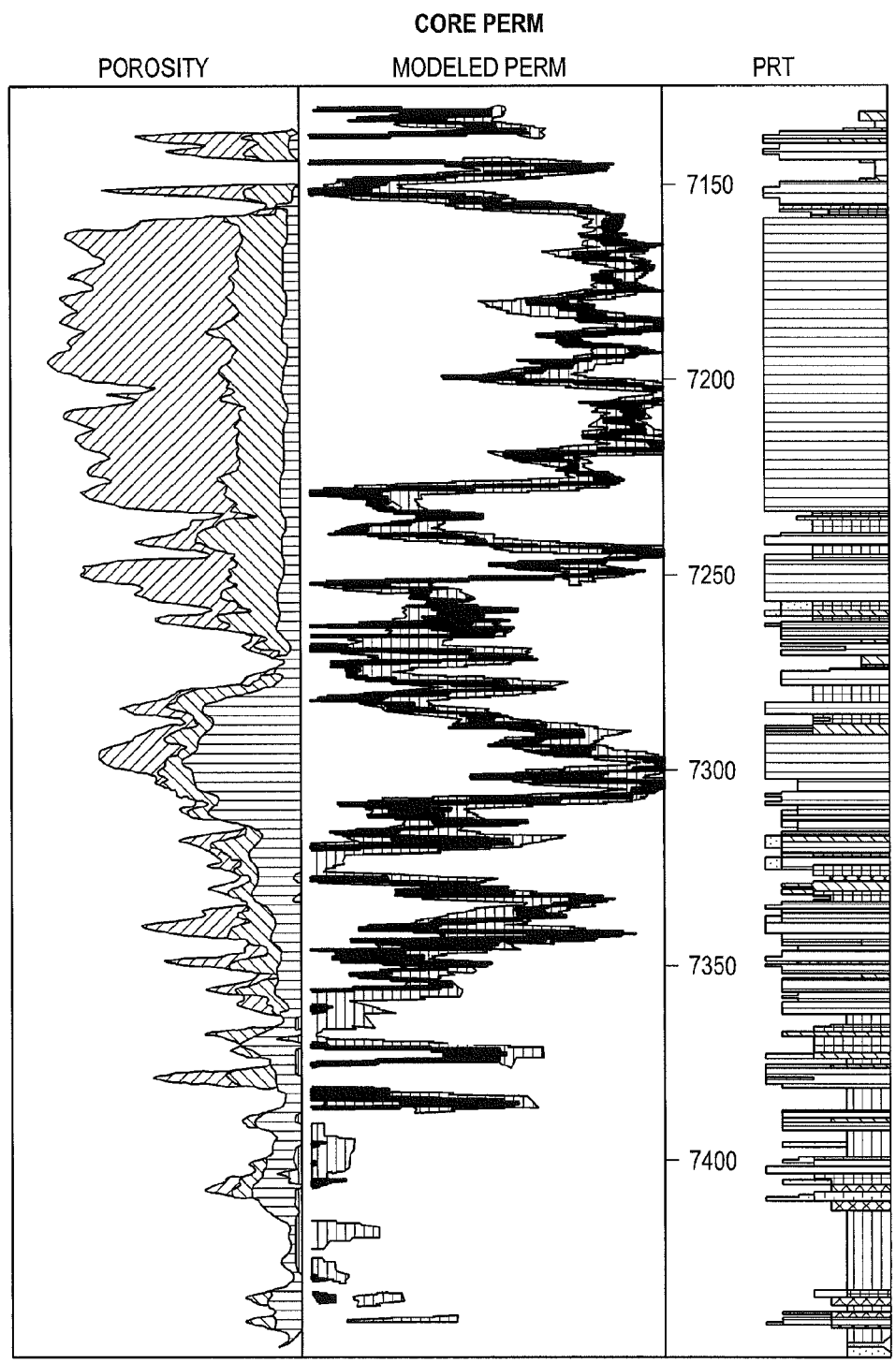
FIG. 4A is a display of plots in well log format of example modeling data from processing according to the present invention.
Figure 4B:
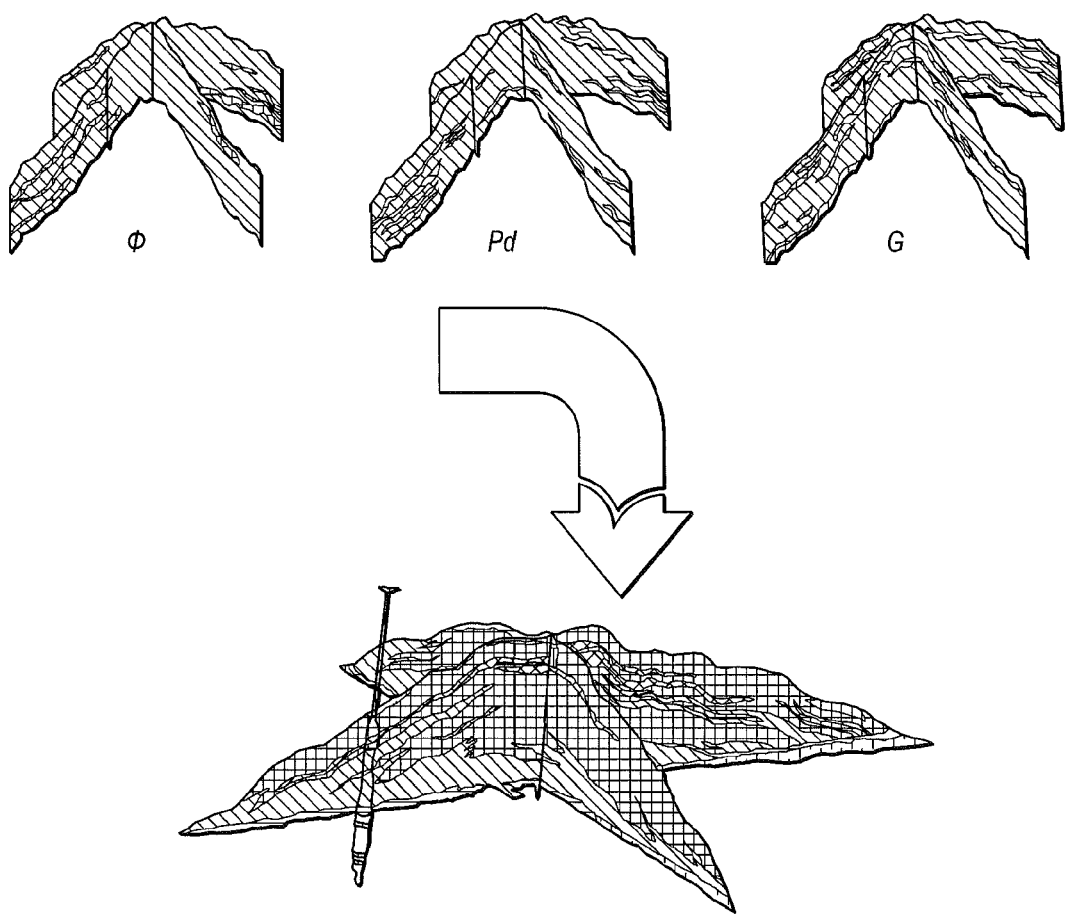
FIG. 4B is a display of 3-dimensional data plots of example modeling data from processing according to the present invention.

FIG. 4A is a display of modeling the results of processing according to FIG. 4 at an individual well. FIG. 4A is an example log plot display as a function of depth for well data obtained as a result of such processing. As indicated, porosity, modeled permeability, petrophysical rock types (PRT's) and cap pressure (Pc) attributes are displayed as parameters. FIG. 4B is an example display of modeling the results of processing according to FIG. 4 at a 3-dimensional model level. As indicated, porosity φ, entry cap pressure Pd and pore-size variability curvature G are displayed as attributes. SwUP determination in FIG. 4 indicates the various input data types which go into the calculations with the present invention. FIG. 4A shows the input well logs and output calculated log visualization at a single well. FIG. 4B shows the same input and output but visualized in the 3D geological model format.

Modify and Adjust Field Development Strategy (Step 112): This step involves geologists and analysts evaluating the processing results for the purpose of modifying and adjusting field development strategy based upon the best indicative model generated from steps 100 through 110. By doing such optimization, the ultimate recovery of potentially billions of additional barrels of hydrocarbon reserves is possible.

Processing according the present invention as illustrated in FIG. 1 can be considered to be a continuous cycle or loop. The "loop" means it is to be repeated and is a continuous process. Starting with an initial geological model, the various processing steps are performed to produce a new geological model. Field development in the form of a field development strategy is based on the model to drill additional wells for production. As new wells are being drilled, new well logs and cores are being acquired. With the new information in hand, the current best 3D geological model is being continuously updated. The continuous field development furnishes a roadmap for further development of the reservoir in the models being formed. The new data and interpretation is incorporated into the existing model and processing loops back to Step 100 as schematically indicated in FIG. 1 to update the model and repeat the process.

Figure 9:
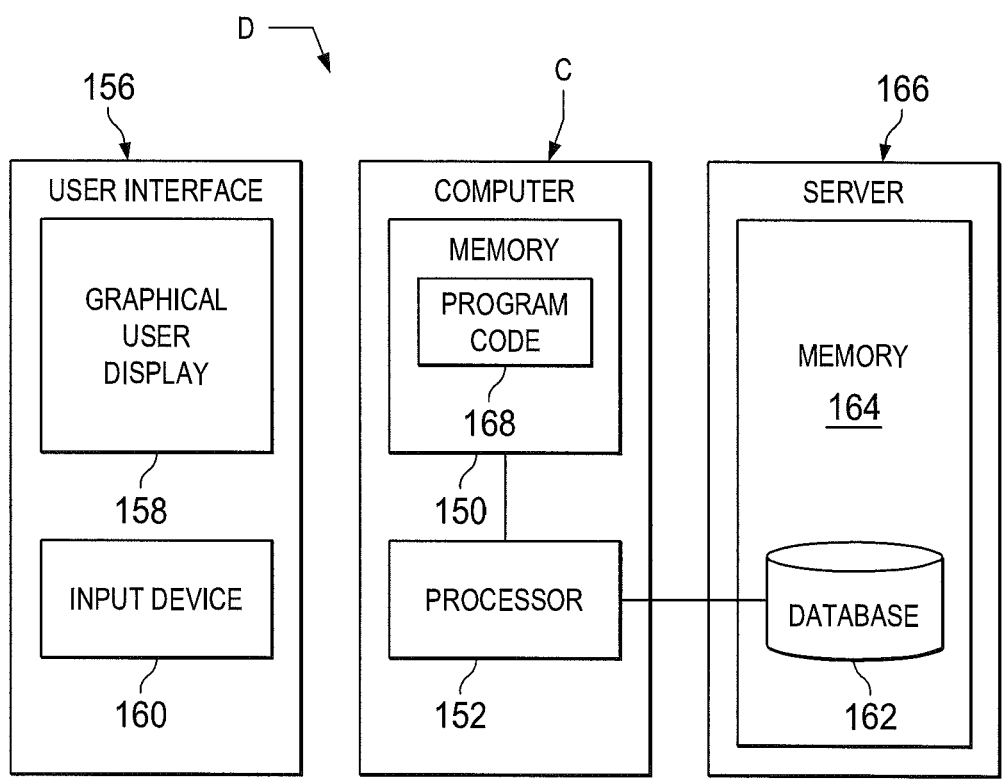
FIG. 9 is a schematic block diagram of a data processing system for three-dimensional multi-modal core and geophysical modeling according to the present invention.

As illustrated in FIG. 9, a data processing system D according to the present invention includes a computer 150 having a processor 152 and memory 154 coupled to processor 152 to store operating instructions, control information and database records therein. The computer 150 may, if desired, be a portable digital processor, such as a personal computer in the form of a laptop computer, notebook computer or other suitable programmed or programmable digital data processing apparatus, such as a desktop computer. It should also be understood that the computer 150 may be a multicore processor with nodes such as those from Intel Corporation or Advanced Micro Devices (AMD), an HPC Linux cluster computer or a mainframe computer of any conventional type of suitable processing capacity such as those available from International Business Machines (IBM) of Armonk, N.Y. or other source.

The computer 150 has a user interface 156 and an output data or graphical user display 158 for displaying output data or records of lithological facies and reservoir attributes according to the present invention. The output display 158 includes components such as a printer and an output display screen capable of providing printed output information or visible displays in the form of graphs, data sheets, graphical images, data plots and the like as output records or images.

The user interface 156 of computer 150 also includes a suitable user input device or input/output control unit 160 to provide a user access to control or access information and database records and operate the computer 150. Data processing system D further includes a database 162 stored in computer memory, which may be internal memory 154, or an external, networked, or non-networked memory as indicated at 166 in an associated database server 168.

The data processing system D includes program code 170 stored in memory 154 of the computer 150. The program code 170, according to the present invention is in the form of non-transitory computer operable instructions causing the data processor 152 to perform the computer implemented method of the present invention in the manner described above.

It should be noted that program code 170 may be in the form of microcode, programs, routines, or symbolic computer operable languages that provide a specific set of ordered operations that control the functioning of the data processing system D and direct its operation. The instructions of program code 170 may be stored in non-transitory form in memory 154 of the computer 150, or on computer diskette, magnetic tape, conventional hard disk drive, electronic read-only memory, optical storage device, or other appropriate data storage device having a non-transitory computer usable medium stored thereon. Program code 170 may also be contained in non-transitory form on a data storage device such as server 168 as a computer readable medium.

The method of the present invention performed in the computer 150 can be implemented utilizing the computer program steps of FIGS. 1, 2 and 4 stored in memory 154 and executable by system processor 152 of computer 150. The input data to processing system D are the input parameters and reservoir data of the types described above.

It can thus be seen that the present invention provides a loop processing methodology for determining geological model attributes of billions of reservoir cells based on geological facies guidance from well core, and then digitally describing associated pore systems to the sub-micron level, identifying the pertinent pore types e.g., macroporosity and multiple microporosity types, and then incorporating multimodal petrophysical algorithms into the 3D modeling application. These 3-dimensional static models can then be meshed with the facies-based recovery processes to establish proper recovery strategy, which can lead to potentially billions of barrels of production increases through optimal recovery practices.

The present invention thus integrates traditionally independent processes and creates new applications and workflows to link and digitally calibrate different pieces to generate a sound scientific and business solution. Geological model attributes like the permeability and the relative permeability are not assigned but calculated for each geocell using transform equations acting upon pore system parameters. The reservoir attributes are far more strongly related to their rock types over their spatial location distribution. The processing determinations also incorporate the various geological facies interpreted at each model cell location.

Therefore, the geological facies play an important role in determining model computation algorithms. The geological facies are guided from the well log data and core descriptions which contain the ground truth. The process requires that all data to be fully digital. Core description is generally done in a manual drawing fashion. While accurate, it lacks the digital format which this new process requires. Macroporosity and microporosity data from core plug analyses or specific well log analyses are captured digitally for input. Hydrocarbons contained in macroporosity and microporosity has separate flow behaviors in terms of permeability, relative permeability and flow rates. It is generally found that a sizable hydrocarbon volume is contained in some microporosity (Type 1) alongside the hydrocarbons in the macroporosity porosity. Most recovery practice focus only on the macro-porosity due to its large volume and rapid flow especially in the early stages of reservoir production. Lack of understanding and proper analyses have limited the ability to derive specific production characteristic algorithms from the microporosity.

The present invention thus incorporates fully multi-modal petrophysical algorithms into a 3-dimensional geological modeling application. The value of this process is that proper modeling of the static and dynamic aspects of the hydrocarbons in the microporosity leads to improved optimal reservoir recovery strategies that could result in billions of barrels in additional recovery.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined methodology, or in the performance of the same, requires the claimed matter in the following claims; such techniques and procedures shall be covered within the scope of the invention.

It should be noted and understood that there can be improvements and modifications made of the present invention described in detail above without departing from the spirit or scope of the invention as set forth in the accompanying claims.

What is claimed is:

1. A computer implemented method of forming with a computer system a static geological model of petrophysical properties representing the nature and structure, and the relative presence of microporosity and macroporosity, of the formations of a subsurface reservoir, the static geological model being organized into a number of cells arranged in an organized three-dimensional grid of cells according to the dimensions and volume of the reservoir, the static geological model being formed based on well logs obtained from wells in the subsurface reservoir, rock types of the subsurface rock formations, and well core description data comprising petrophysical measurements obtained from analysis of well core samples of rock formations adjacent cored wells of the wells in the subsurface reservoir in which core samples have been obtained, the method comprising the computer processing steps of:
   (a) forming a geostatistical model of the presence of lithofacies over the subsurface reservoir based on the well logs obtained from wells in the subsurface reservoir and the well core samples from the cored wells in the reservoir in which well core samples have been obtained;
   (b) forming a lithofacies model of postulated facies logs for the wells in the reservoir in which core samples have not been obtained, based on the petrophysical measurements from the well core samples for the cored wells in the reservoir;
   (c) forming a digital core description of the lithology of the cells of the subsurface reservoir as functions of depth in the well bores based on the formed initial geostatistical model of spatial distribution of the presence of lithofacies and the formed lithofacies model;
   (d) receiving identifications of the presence of macroporosity and microporosity in the subsurface lithofacies in the three dimensional grid of cells of the static geological model based on the testing of the well core samples obtained from the cored wells in the subsurface reservoir;
   (e) forming the static geological model of the petrophysical properties of the reservoir representing the nature and structure, and the relative presence of microporosity and macroporosity, of the formations of the reservoir by petrophysical uncertainty modeling based on: the well logs obtained from wells in the subsurface reservoir; the rock types of the subsurface rock formations; the well core description data obtained from analysis of the well core samples; and the identified presence of macroporosity and microporosity in the subsurface lithofacies; and
   (f) forming an output display of the static geological model of petrophysical properties representing the nature and structure, and the relative presence of microporosity and macroporosity, in the cells of the formations of the reservoir model for development of the reservoir.

2. The computer implemented method of claim 1, wherein the step of forming a geostatistical model comprises the step of processing the well logs and the well core description data to determine lithofacies data for the cells of the reservoir model adjacent the well bores in the reservoir.

3. The computer implemented method of claim 2, wherein the step of forming a lithofacies model further includes the step of upscaling the postulated facies logs for wells in the reservoir in which core samples have not been obtained to a three-dimensional model of the facies of the reservoir.

4. The computer implemented method of claim 3, wherein the step of forming a lithofacies model comprises the step of forming a facies model of the results from upscaling the facies logs.

5. A data processing system for computerized simulation of a static geological model of petrophysical properties representing the nature and structure, and the relative presence of microporosity and macroporosity, of the formations of a subsurface reservoir, the static geological model being organized into a number of cells arranged in an organized three-dimensional grid of cells according to the dimensions and volume of the reservoir, the static geological model being formed based on well logs obtained from wells in the subsurface reservoir, rock types of the subsurface rock formations, and well core description data comprising petrophysical measurements obtained from analysis of well core samples of rock formations adjacent cored wells of the wells in the subsurface reservoir in which core samples have been obtained, the data processing system comprising:
   (a) a processor performing the steps of:
      (1) forming a geostatistical model of the presence of lithofacies over the subsurface reservoir based on the well logs obtained from wells in the subsurface reservoir and the well core samples from the cored wells in the reservoir in which well core samples have been obtained;
      (2) forming a lithofacies model of postulated facies logs based on the petrophysical measurements from the well core samples for the cored wells in the reservoir;
      (3) forming a digital core description of lithology of the cells of the subsurface reservoir as functions of depth in the well bores based on the formed initial geostatistical model of spatial distribution of the presence of lithofacies and the formed lithofacies model;
      (4) receiving identifications of the presence of macroporosity and microporosity in the subsurface lithofacies in the three dimensional grid of cells of the static geological model based on the testing of the well core samples obtained from the cored Delis in the subsurface reservoir;
      (5) forming the static geological model of the petrophysical properties of the reservoir representing the nature and structure, and the relative presence of microporosity and macroporosity, of the formations of the reservoir by petrophysical uncertainty modeling based on: the well logs obtained from wells in the subsurface reservoir; the rock types of the subsurface rock formations; the well core description data obtained from analysis of well core samples; and the identified presence of macroporosity and microporosity in the subsurface lithofacies; and
   (b) a display forming an output display of the static geological model of petrophysical properties representing the nature and structure, and the relative presence of microporosity and macroporosity, in the cells of the formations of the reservoir model for development of the reservoir.

6. The data processing system of claim 5, wherein the processor in forming a geostatistical model process the well logs and the well core description data to determine lithofacies data for the cell of the reservoir model adjacent the well bore in the reservoir.

7. The data processing system of claim 6, wherein the processor in forming a lithofacies model further upscales the facies logs for wells in the reservoir in which core samples have not been obtained to a three-dimensional model of the facies of the reservoir.

8. The data processing system of claim 5, wherein the processor in forming a lithofacies model forms a facies model of the upscaled facies logs.

9. A data storage device having stored in a non-transitory computer readable medium non-transitory computer operable instructions for causing a data processing system to form a static geological model of petrophysical properties representing the nature and structure, and the relative presence of microporosity and macroporosity, of the formations of a subsurface reservoir, the static geological model being organized into a number of cells arranged in an organized three-dimensional grid of cells according to the dimensions and volume of the reservoir, the static geological model being formed based on well logs obtained from wells in the subsurface reservoir, rock types of the subsurface rock formations, and well core description data comprising petrophysical measurements obtained from analysis of well core samples of rock formations adjacent cored wells in the subsurface reservoir, the instructions stored in the computer readable medium causing the data processing system to perform the steps of:

(a) forming a geostatistical model of the presence of lithofacies over the subsurface reservoir based on logs obtained from wells in the subsurface reservoir and the well core samples from the cored wells in the reservoir in which well core samples have been obtained;

(b) forming a lithofacies model of postulated facies logs for the wells in the reservoir in which core samples have not been obtained, based on the petrophysical measurements from the well core samples for the cored wells in the reservoir;

(c) forming a digital core description of the lithology of the cells of the subsurface reservoir as functions of depth in the well bores based on the formed initial geostatistical model of spatial distribution of the presence of lithofacies and the formed lithofacies model;

(d) receiving identifications of the presence of macroporosity and microporosity in the subsurface lithofacies in the three dimensional grid of cells of the static geological model based on the testing of the well core samples obtained from the cored wells in the subsurface reservoir;

(e) forming the static geological model of the petrophysical properties of the reservoir representing the nature and structure, and the relative presence of microporosity and macroporosity, of the formations of the reservoir by petrophysical uncertainty modeling based on: the well logs obtained from wells in the subsurface reservoir; the rock types of the subsurface rock formations; the well core description data obtained from analysis of the well core samples; and the identified presence of macroporosity and microporosity in the subsurface lithofacies; and (f) forming an output display of the static geological model of petrophysical properties representing the nature and structure, and the relative presence of microporosity and macroporosity, in the cells of the formations of the reservoir model for development of the reservoir.

10. The data storage device of claim 9, wherein the instructions for forming an initial geostatistical model further cause the data processing system to process the well logs and the well core description data to determine lithofacies data for the cells of the reservoir model adjacent the well bores in the reservoir.

11. The data storage device of claim 10, wherein the instructions for forming a lithofacies model further cause the data processing system to upscale the facies logs for wells in the reservoir in which core samples have not been obtained to a three-dimensional model of the facies of the reservoir.

12. The data storage device of claim 10, wherein the instructions for forming a lithofacies model further cause the data processing system to form a facies model of the upscaled facies logs.

13. The data storage device of claim 9, wherein the data processing system includes a data display and the instructions include instructions causing the data processing system to form an output display of the nature and structure of formations of the reservoir.

* * * * *

UNITED STATES PATENT AND TRADEMARK OFFICE
CERTIFICATE OF CORRECTION

PATENT NO.        : 9,684,084 B2
APPLICATION NO.   : 13/873463
DATED             : June 20, 2017
INVENTOR(S)       : Roger R. Sung and Edward A. Clerke It is certified that error appears in the above-identified patent and that said Letters Patent is hereby corrected as shown below:

In the Claims

In Claim 5, Column 12, Line 42 the claim language reads: "well core samples obtained from the cored Delis" - It should read: "well core samples obtained from the cored wells"

In Claim 6, Column 12, Line 62 the claim language reads: "processor in forming a geostatistical model process the well" - It should read: "processor in forming a geostatistical model processes the well"

In Claim 6, Column 12, Line 64 the claim language reads: "data for the cell of the reservoir model adjacent" - It should read: "data for the cells of the reservoir model adjacent"

In Claim 6, Column 12, Line 65 the claim language reads: "well bore in the reservoir" - It should read: "well bores in the reservoir"

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*